(12) United States Patent
Kojima et al.

(10) Patent No.: US 7,249,305 B2
(45) Date of Patent: *Jul. 24, 2007

(54) SIGNAL PROCESSING METHOD AND APPARATUS, SIGNAL REPRODUCING METHOD AND APPARATUS, AND RECORDING MEDIUM

(75) Inventors: Tadashi Kojima, Yokohama (JP); Hisashi Yamada, Yokohama (JP); Kouya Tochikubo, Yokohama (JP); Hideki Mimura, Yokohama (JP); Taku Kato, Kamakura (JP); Tooru Kamibayashi, Chigasaki (JP); Akio Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/302,281

(22) Filed: Dec. 14, 2005

(65) Prior Publication Data

US 2006/0123319 A1   Jun. 8, 2006

Related U.S. Application Data

(63) Continuation of application No. 10/290,477, filed on Nov. 8, 2002, now Pat. No. 7,017,100.

(30) Foreign Application Priority Data

Nov. 9, 2001   (JP)   ............................. 2001-345186

(51) Int. Cl.
*H03M 13/29* (2006.01)
(52) U.S. Cl. ............................ 714/755; 380/3; 714/769
(58) Field of Classification Search ................ 714/755, 714/769; 380/3
See application file for complete search history.

(56) References Cited

U.S. PATENT DOCUMENTS

| 5,014,274 | A | * | 5/1991 | Higurashi et al. .......... 714/768 |
| 5,365,530 | A | * | 11/1994 | Yoshida ..................... 714/755 |
| 5,371,750 | A | * | 12/1994 | Inoue et al. ................ 714/755 |
| 5,714,952 | A | | 2/1998 | Wada |
| 5,901,127 | A | | 5/1999 | Sako et al. |
| 6,029,259 | A | | 2/2000 | Sollish et al. |
| 6,311,305 | B1 | * | 10/2001 | Sollish et al. ............... 714/784 |
| 6,314,542 | B1 | * | 11/2001 | Nagai et al. ................ 714/755 |
| 6,320,829 | B1 | | 11/2001 | Matsumoto et al. |
| 6,347,145 | B2 | | 2/2002 | Kato et al. |
| 6,409,683 | B1 | | 6/2002 | Fonseca et al. |
| 6,445,795 | B1 | | 9/2002 | Sako et al. |
| 6,490,683 | B1 | | 12/2002 | Yamada et al. |
| 6,556,679 | B1 | | 4/2003 | Kato et al. |

(Continued)

FOREIGN PATENT DOCUMENTS

EP   0 944 084 A2   9/1999

(Continued)

*Primary Examiner*—Stephen M. Baker
(74) *Attorney, Agent, or Firm*—Pillsbury Winthrop Shaw Pittman, LLP

(57) ABSTRACT

A signal processing method multiplexes/arranges digital data of a specific unit to form a predetermined unit, adds an error correction code to the predetermined unit to constitute an error correction coded block, replaces a part of the error correction coded block with specific data, and outputs the error correction coded block with the specific data being replaced to a transmission medium or a recording medium.

24 Claims, 19 Drawing Sheets

U.S. PATENT DOCUMENTS

| | | |
|---|---|---|
| 6,633,723 B1 | 10/2003 | Kuroda et al. |
| 6,684,199 B1 | 1/2004 | Stebbings |
| 6,715,122 B2 | 3/2004 | Carson et al. |
| 6,718,501 B1 | 4/2004 | Brody et al. |
| 6,792,538 B1 | 9/2004 | Kuroda et al. |
| 6,826,137 B1 | 11/2004 | Lee et al. |
| 2001/0033658 A1 | 10/2001 | Yoshida et al. |
| 2001/0046295 A1 | 11/2001 | Sako et al. |
| 2002/0069389 A1 | 6/2002 | Sollish et al. |
| 2002/0085722 A1 | 7/2002 | Asano et al. |
| 2003/0061500 A1 | 3/2003 | Mimura et al. |
| 2003/0070082 A1 | 4/2003 | Nimura et al. |
| 2003/0115534 A1 | 6/2003 | Kojima et al. |

FOREIGN PATENT DOCUMENTS

| | | |
|---|---|---|
| JP | 6-20403 | 1/1994 |
| JP | 08-204584 | 9/1996 |
| JP | 08-286840 | 11/1996 |
| JP | 9-73414 | 3/1997 |
| JP | 9-93226 | 4/1997 |
| JP | 09-128890 | 5/1997 |
| JP | 10-106148 | 4/1998 |
| JP | 10-241290 | 9/1998 |
| JP | 10-320779 | 12/1998 |
| JP | 11-86436 | 3/1999 |
| JP | 11-154184 | 6/1999 |
| JP | 11-238305 | 8/1999 |
| JP | 2000-3560 | 1/2000 |
| JP | 2000-339699 | 12/2000 |
| JP | 2001-43138 | 2/2001 |
| JP | 2001-77806 | 3/2001 |
| JP | 2001-135019 | 5/2001 |
| JP | 2002-84271 | 3/2002 |
| JP | 2003-132625 | 5/2003 |

\* cited by examiner

FIG. 4
PRIOR ART

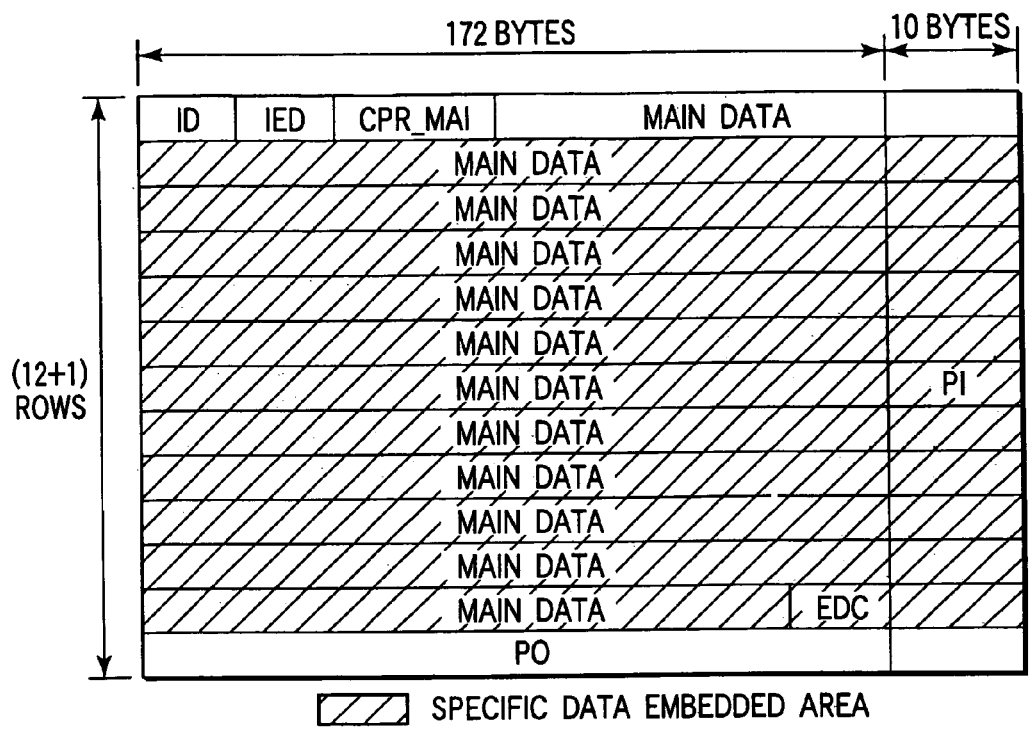
F I G. 16
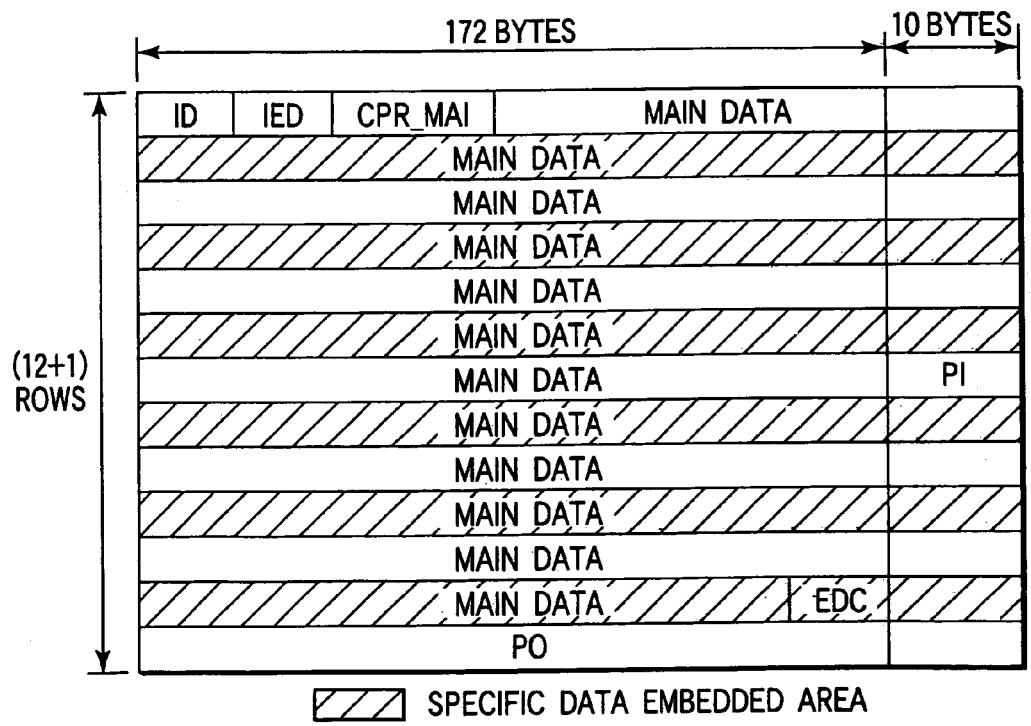
F I G. 17

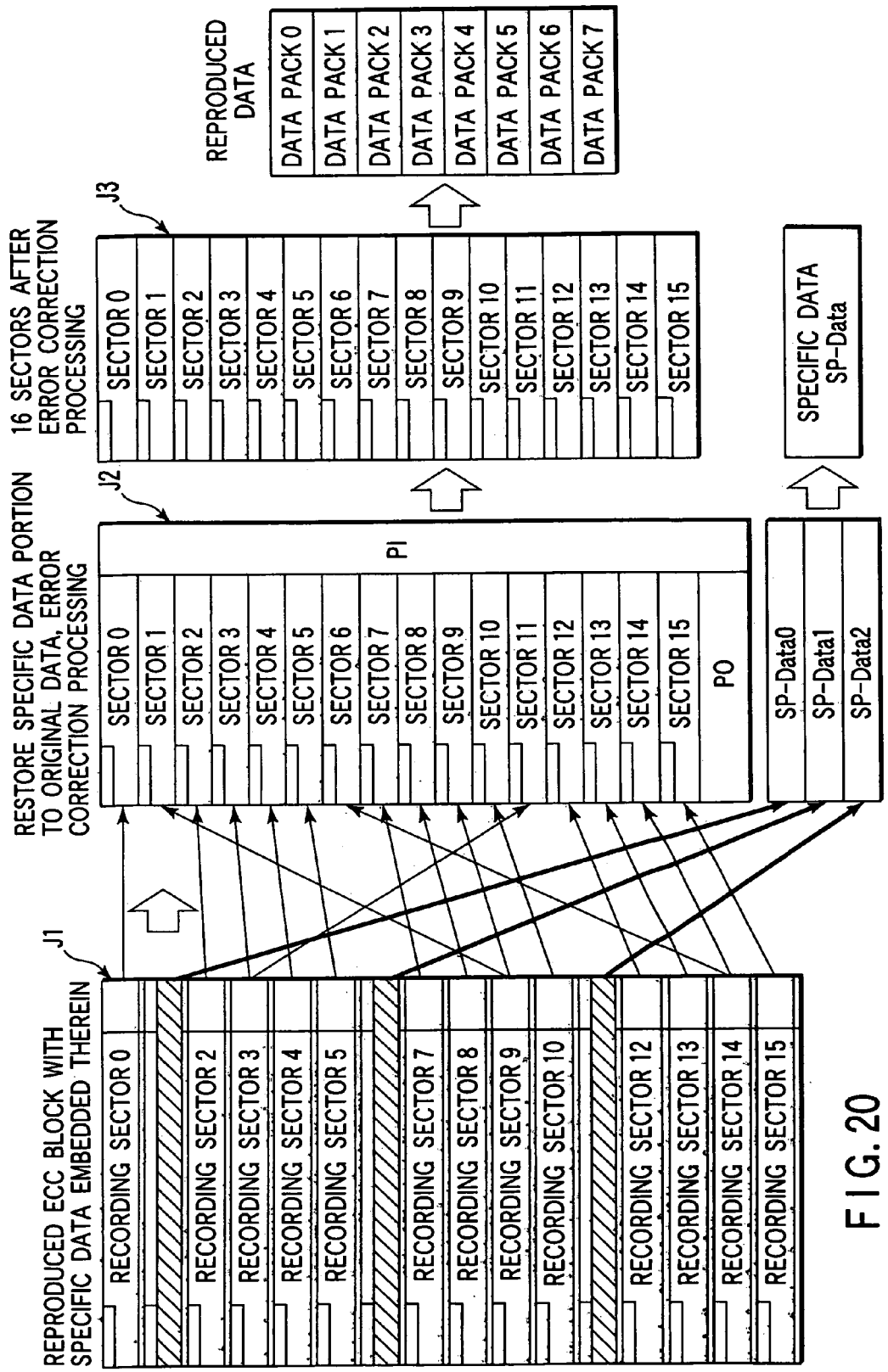
F I G. 20

SIGNAL PROCESSING METHOD AND APPARATUS, SIGNAL REPRODUCING METHOD AND APPARATUS, AND RECORDING MEDIUM

CROSS-REFERENCE TO RELATED APPLICATIONS

This application is a continuation of U.S. application Ser. No. 10/290,477, filed Nov. 8, 2002 now U.S. Pat. No. 7,017,100, and for which priority is claimed under 35 U.S.C. §120. This application is based upon and claims the benefit of priority under 35 U.S.C. § 119 from the prior Japanese Patent Application No. 2001-345186, filed, Nov. 9, 2001. The contents of both applications are incorporated herein by reference in their entireties.

BACKGROUND OF THE INVENTION

1. Field of the Invention

The present invention relates to a signal processing method and apparatus for recording a digital signal in a recording medium or for transmitting to a transmission medium, a signal reproducing method and apparatus for reproducing the digital signal recorded in the recording medium or transmitted via the transmission medium, and further a recording medium in which the digital signal is recorded.

2. Description of the Related Art

Recently, any type of information can be digitized and technology capable of distributing such information through transmission media or recording media has been developed, as expressed by the term "digital revolution." As a result, a great number of people have come to acquire digital information freely. In such an environment, signals such as digital audio signals, digital video signals, relating data which computers handle are recorded in a recording medium. Information transmission and storage are carried out so that the above-described signals are reproduced from the recording medium, information is copied to a read-only medium, transmitted information is reproduced or information is transmitted through a transmission line.

Recently, as a recording medium capable of recording a large volume of video/audio information, the digital versatile disc (DVD) has been realized. A movie over two hours long is recorded in a DVD and such DVD recorded information is reproduced through a playback apparatus, so that the movie can be watched freely at home.

DVDs are classified into: read-only DVD-ROMs, DVD-Rs which allow a one-time recording, and DVD-RW, DVD-RAM which allow re-recording.

An application standard for DVD-ROM includes a DVD-video standard which allows a whole movie to be recorded in a single disc. A user can acquire information based on digital signals freely through reproduction of such DVD-video discs or reception of digital broadcasting. Under such circumstances, if the acquired digital signals are copied to a recording medium such as a hard disc and the aforementioned DVD-RAM and encoded with an encoder based on the DVD-video standard, it is possible to copy a disc.

Thus, in a DVD-video, digital information to be recorded is encrypted. The copy protect method employing cryptography technology functions effectively for a DVD-video disc or DVD-ROM, in which encrypted information is prerecorded.

Examples of a conventional technique relating to encryption include a technique described in Jpn. Pat. Appln. KOKAI Publication No. 11-86436. In this technique, specific data different from main information data is mixed in an error correction code block. The specific data is used as copy inhibition information. Another example is a technique described in Jpn. Pat. Appln. KOKAI Publication No. 9-128890. In this technique, in order to prevent illegal copy of the digital signal, a part of an error correction code is replaced with specific data (such as an encryption key) and recorded. Further example is a technique described in Jpn. Pat. Appln. KOKAI Publication No. 8-204584. In this technique, in a case in which data subjected to an error correction processing is supplied to a decryption processing block, an uncorrectable data portion is changed to a special code including a synchronous code and transmitted so that the portion can be detected by a decryption processing section. An error portion is recognized by using the special code, and decryption is performed based on the error portion.

In a field in which the above-described information/storage processing is performed, it has further become important, in recent years, to handle copyright protection. Particularly, when the information requiring the copyright protection is recorded in a conventional recording medium, illegal copying needs to be prevented. That is, although a copyright holder permits information recording only for one recording medium, the same information may be recorded in a plurality of recording media. As a result, it is absolutely necessary to prevent illegal copying. Moreover, there has been a demand for further reinforcement in the prevention of illegal copying.

BRIEF SUMMARY OF THE INVENTION

The present invention has been developed in consideration of the above-described circumstances, and an object thereof is to provide a signal processing method and apparatus, signal reproducing method and apparatus, and recording medium in which copy protection is reinforced.

According to an embodiment of the present invention, a signal processing method comprises:

multiplexing/arranging digital data of a specific unit to form a predetermined unit;

adding an error correction code to the predetermined unit to constitute an error correction coded block;

replacing a part of the error correction coded block with specific data; and outputting the error correction coded block with the specific data being replaced to a transmission medium or a recording medium.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated herein and constitute a part of the specification, illustrate embodiments of the present invention and, together with the general description given above and the detailed description of the embodiments given below, serve to explain the principles of the present invention, in which:

FIG. 4 is an explanatory view showing the constitution of an ECC block for use in the DVD system;

FIG. 16 is an explanatory view showing a still another example of an embedded place of specific data;

FIG. 17 is an explanatory view showing a further example of an embedded place of specific data;

FIG. 20 is a constitution explanatory view showing a processing process of specific data in a reproduction processing time.

DETAILED DESCRIPTION OF THE INVENTION

An embodiment of the present invention will now be described with reference to the accompanying drawings. A recording/reproducing processing method in/from an information recording medium, which requires an illegal copy prevention processing, will be described hereinafter from a viewpoint of copyright protection. Particularly, a signal processing method and reproducing method and apparatuses regarding data arrangement will be described hereinafter in a case in which concealment information is embedded in a data block.

[I] Background Studied for Realizing the Present Invention

The copyright protection system for use in an optical disc DVD which has remarkably spread in recent years will first be described hereinafter.

Figure 1:
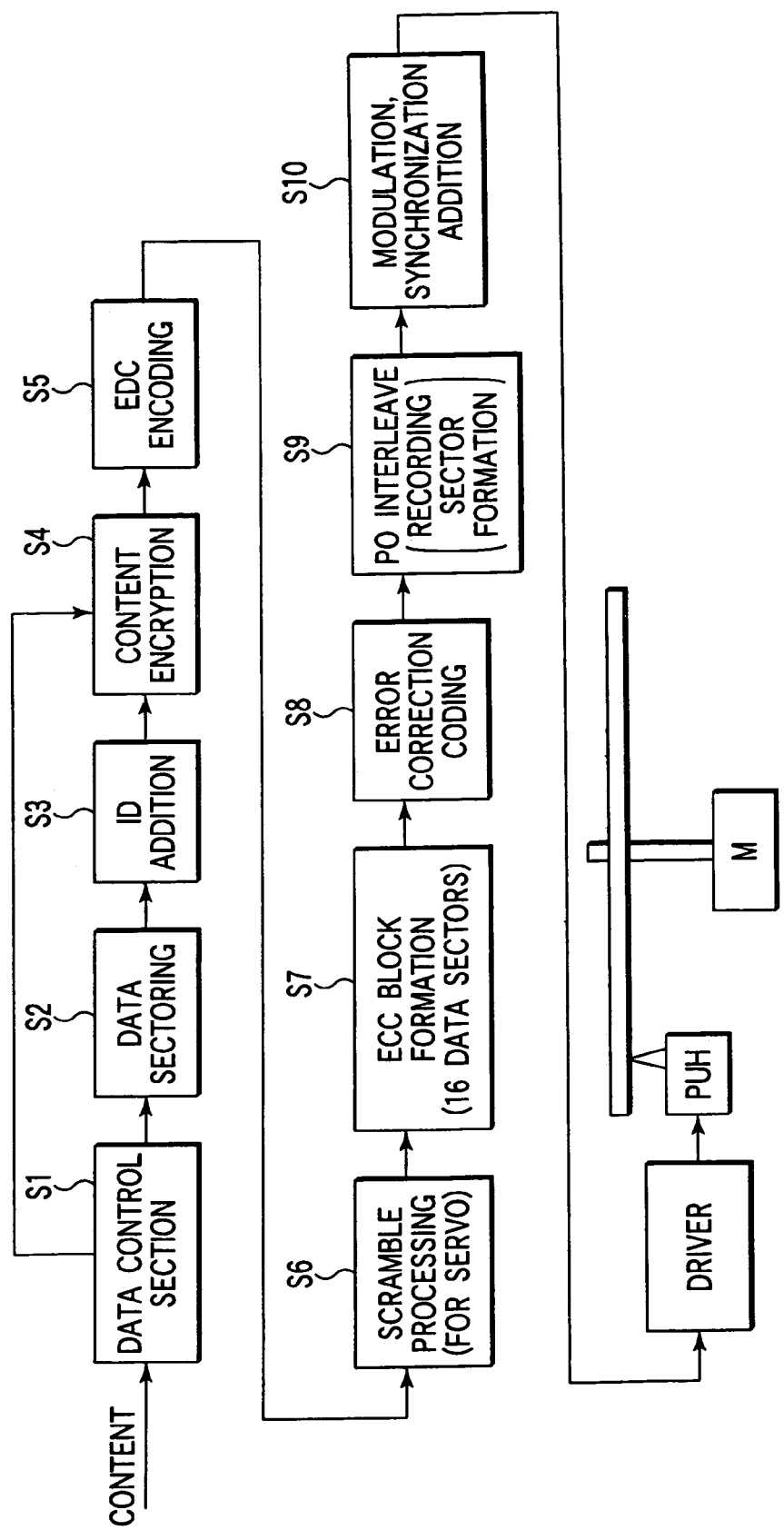
FIG. 1 is a block diagram showing a recording data processing process for use in a DVD system.

FIG. 1 shows signal processing in a recording medium in a copyright protecting system for a DVD-video signal. In data control processing, a video/audio information signal is compressed using MPEG, or the like, and further formatted to a digital data stream having a reproduction control signal or the like added thereto (step S1).

Digital data is divided into sectors of packet data each having the unit of "2 K bytes" (step S2) and an ID which is a sector number is attached to each sector (step S3). Next, data is encrypted (data scramble) (step S4). An error detecting code EDC is attached to the encrypted data (step S5). A data portion is scrambled according to a code determined by ID information so as to stabilize the servo system in reproduction operation (step S6).

The data scramble for the servo system is different from the data scramble for the above-described encryption, so that data is scrambled with open contents. Digital data may be "all 0" or, in a similar case, recording data may be a repetition of a same pattern. In this case, a disc system may have a problem in that a tracking servo error signal cannot be detected accurately, due to cross-talk of an adjacent track. The initial value of an M system generator is determined by an ID value. By multiplying a signal from the M system generator with digital data, data scramble is carried out. This prevents the scrambled recording signal from being a repetition of same pattern. In this specification, the "data scramble" used for servo stabilization will not be described further. The "data scramble" described elsewhere in this specification refers to data scramble used for encryption processing for protection of copyright of information.

The digital data subjected to the above-described processing is converted to blocks based on the error correction code ECC so as to execute error correction processing for every 16 sectors (step S7), and error correction codes of an inner-code parity PI and an outer-code parity PO are generated (step S8).

The outer-code parity PO is distributed in each sector by interleave processing so that a recording sector is constructed (step S9). The recording sector data is modulated through a modulating circuit (step S10) and the modulated signals are recorded by cutting an original disc through a driver and a pickup device. FIG. 1 shows the same structure as a marketed recording/reproducing apparatus whose pickup portion has a different power.

Based on the original disc, a disc manufacturing mold is produced through a disc manufacturing process and then, a large number of discs are copied using an injection machine and provided to the market as a DVD-ROM disc in which video signals are recorded.

Figure 2:
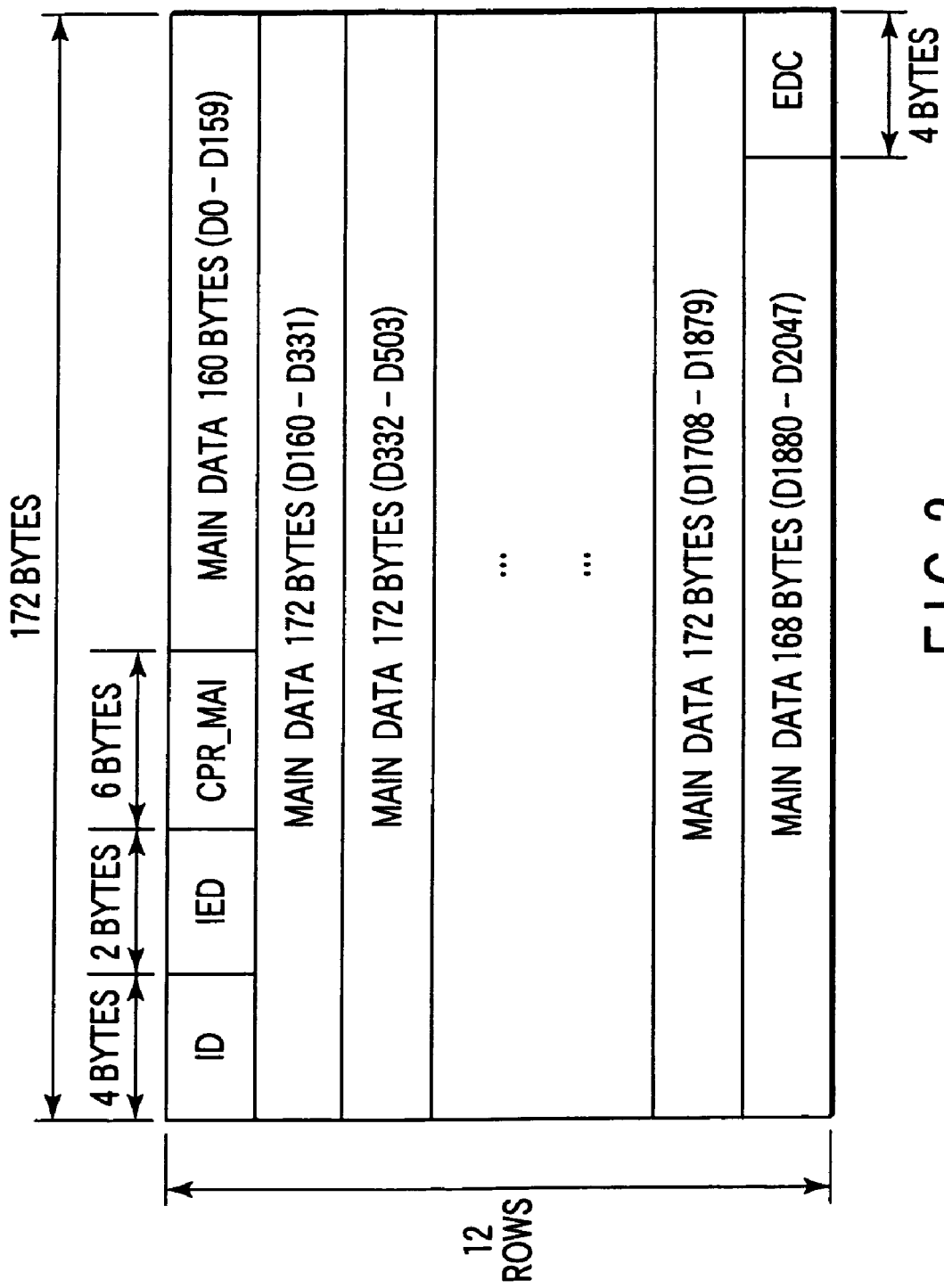
FIG. 2 is an explanatory view showing a constitution of a data sector for use in the DVD system.

FIG. 2 shows the structure of the data sector of FIG. 1. The data sector is constituted of 172 bytes (=1 row)×12 rows and sector identification information ID comprised of a sector number and sector information is arranged at the head row, followed by an ID error detecting code IED, information concerning protection of copyright CPR_MAI, a 2-K byte main data area and finally an error detecting code EDC for main data.

Figure 3:
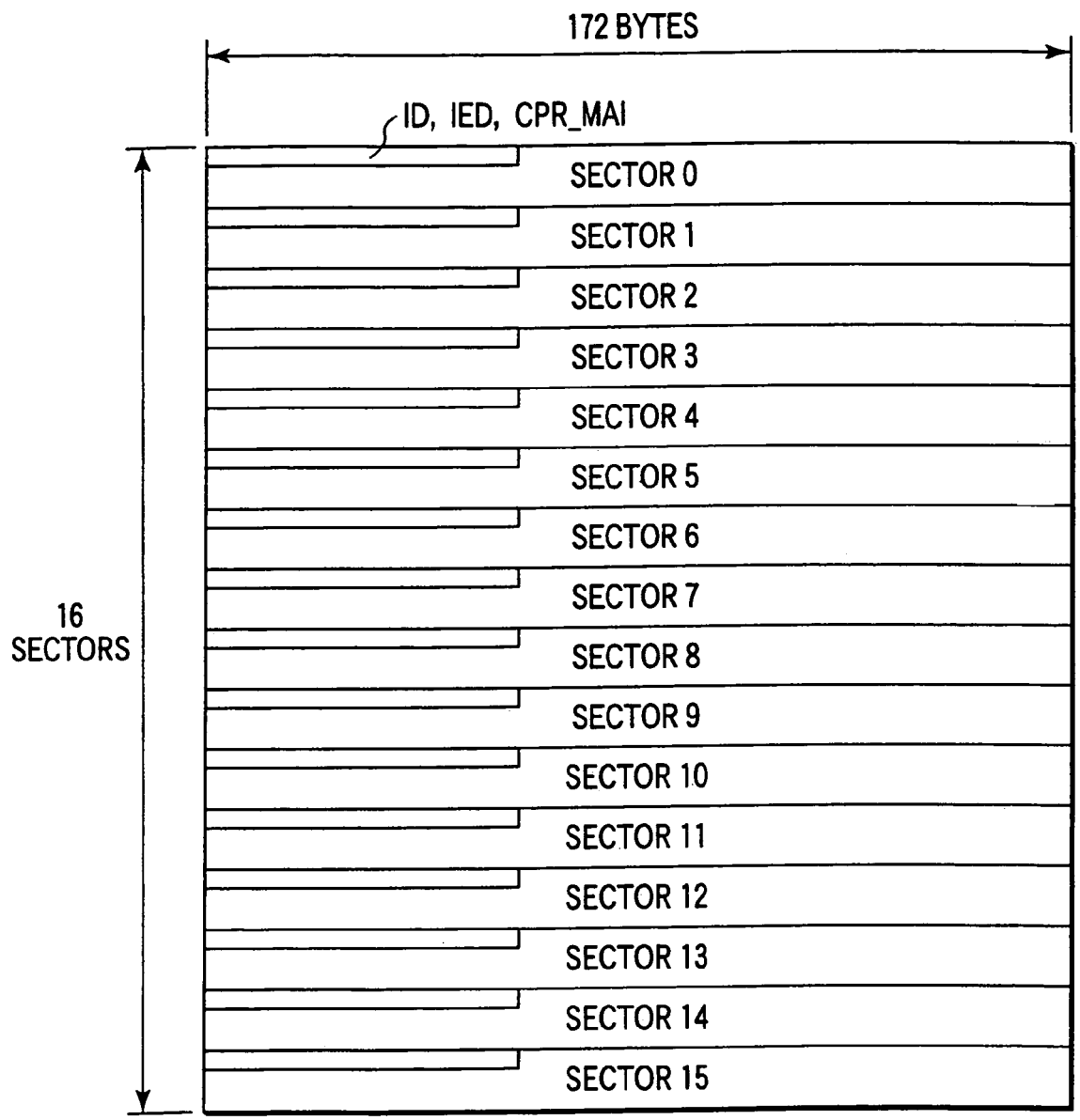
FIG. 3 is an explanatory view showing the constitution of an assembly block of the data sector for use in the DVD system.

FIG. 3 shows a constitution of ECC block. The ECC block comprises 16 data sectors of FIG. 1, and data of 172 bytes×192 rows (=(172 bytes×12 rows)×16 sectors)).

Figure 4:
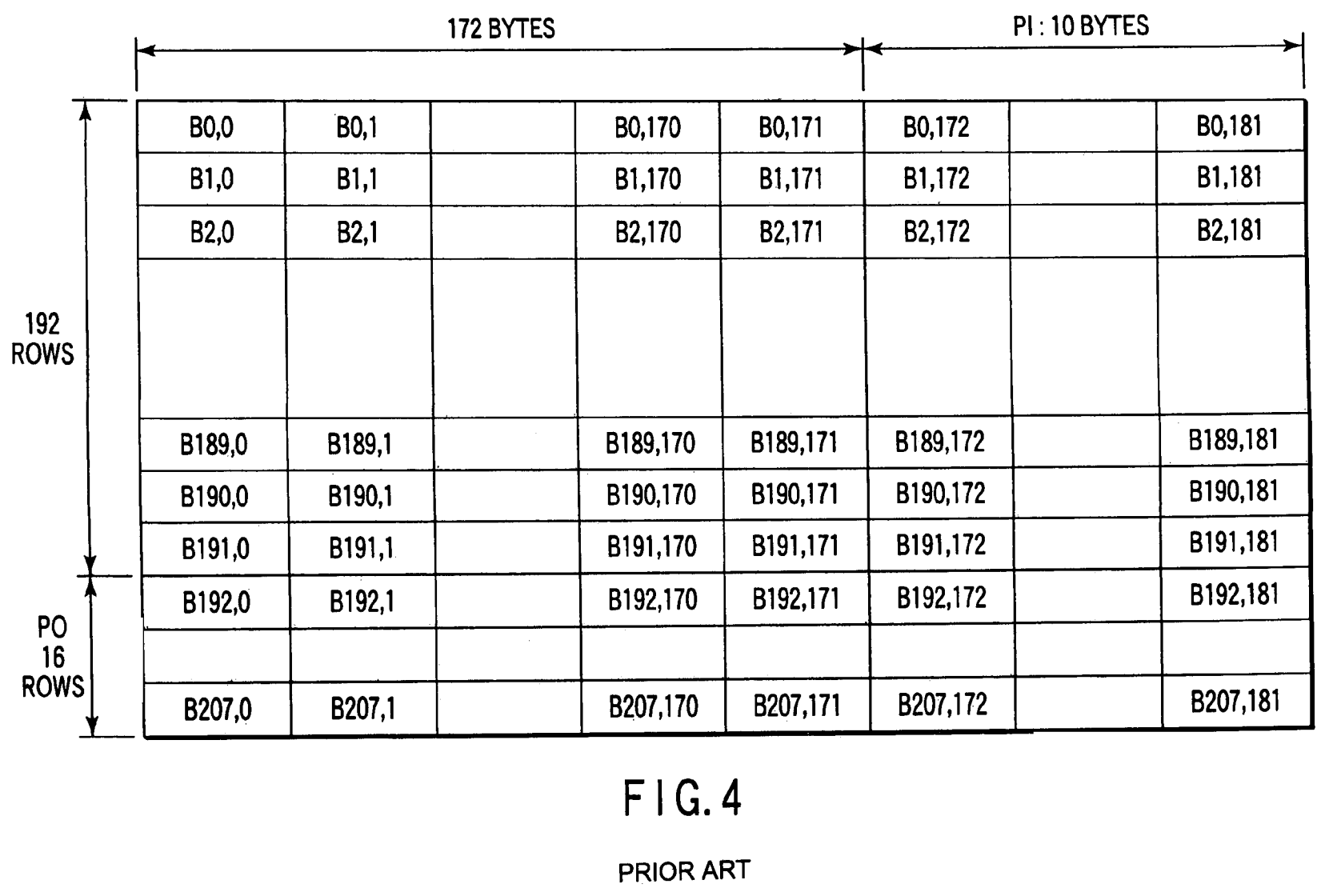
Figure 5:
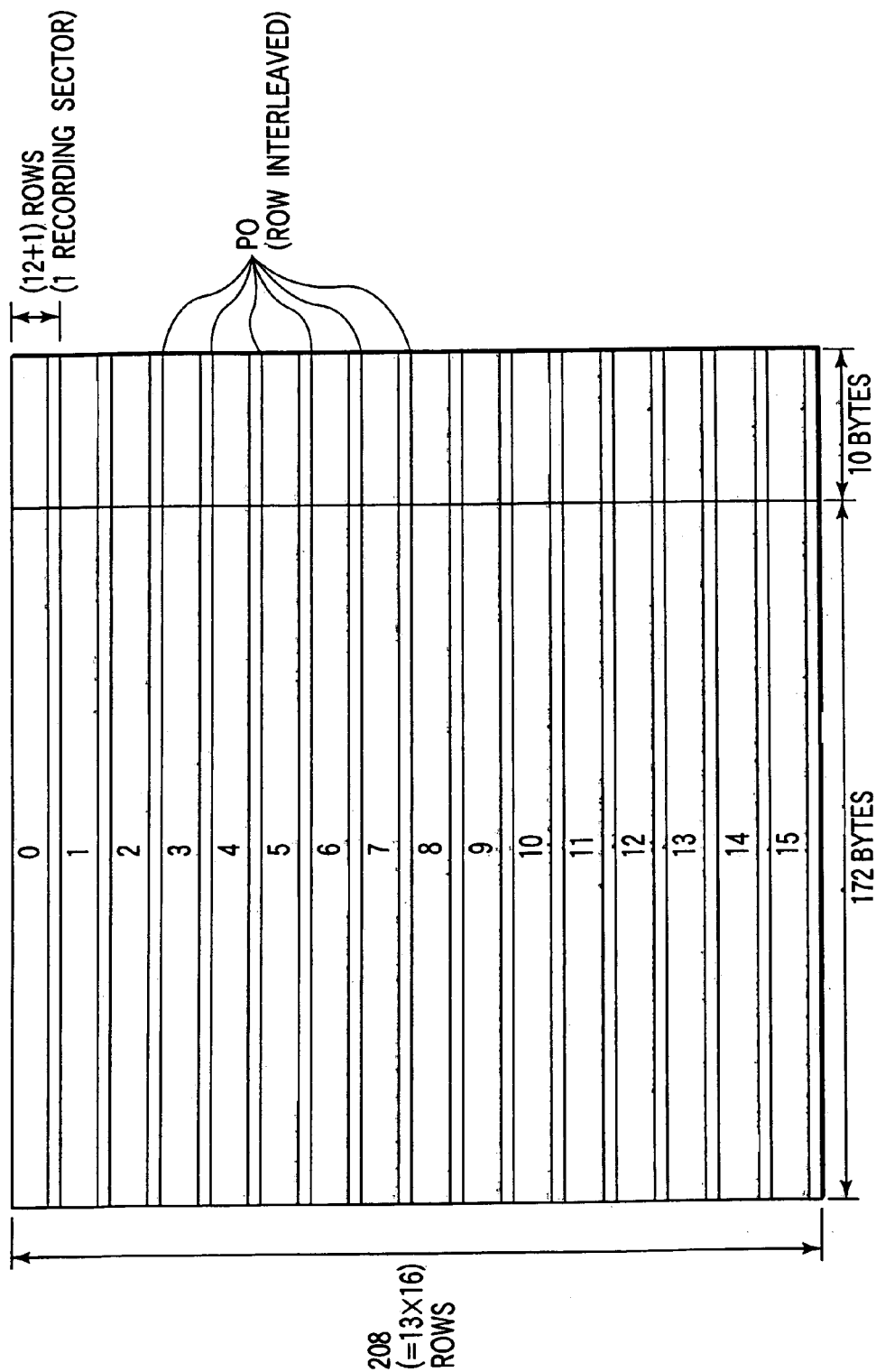
FIG. 5 is an explanatory view showing the constitution of the ECC block for use in the DVD system and after a row interleave processing.

FIG. 4 shows the structure of the ECC block. In data of 172 bytes×192 rows constituted by gathering 16 of the data sectors in FIG. 3, the outer-code parities POs of 16 bytes (16 rows) are generated for each column (vertical direction) while the inner-code parities PIs of 10 bytes (10 columns) are generated for each row (lateral direction). Here, the outer-codes PO of 16 rows (16 bytes) are distributed such that a row (172 bytes) is interleaved for every 12 rows (each sector), as shown in FIG. 5.

Figure 6:
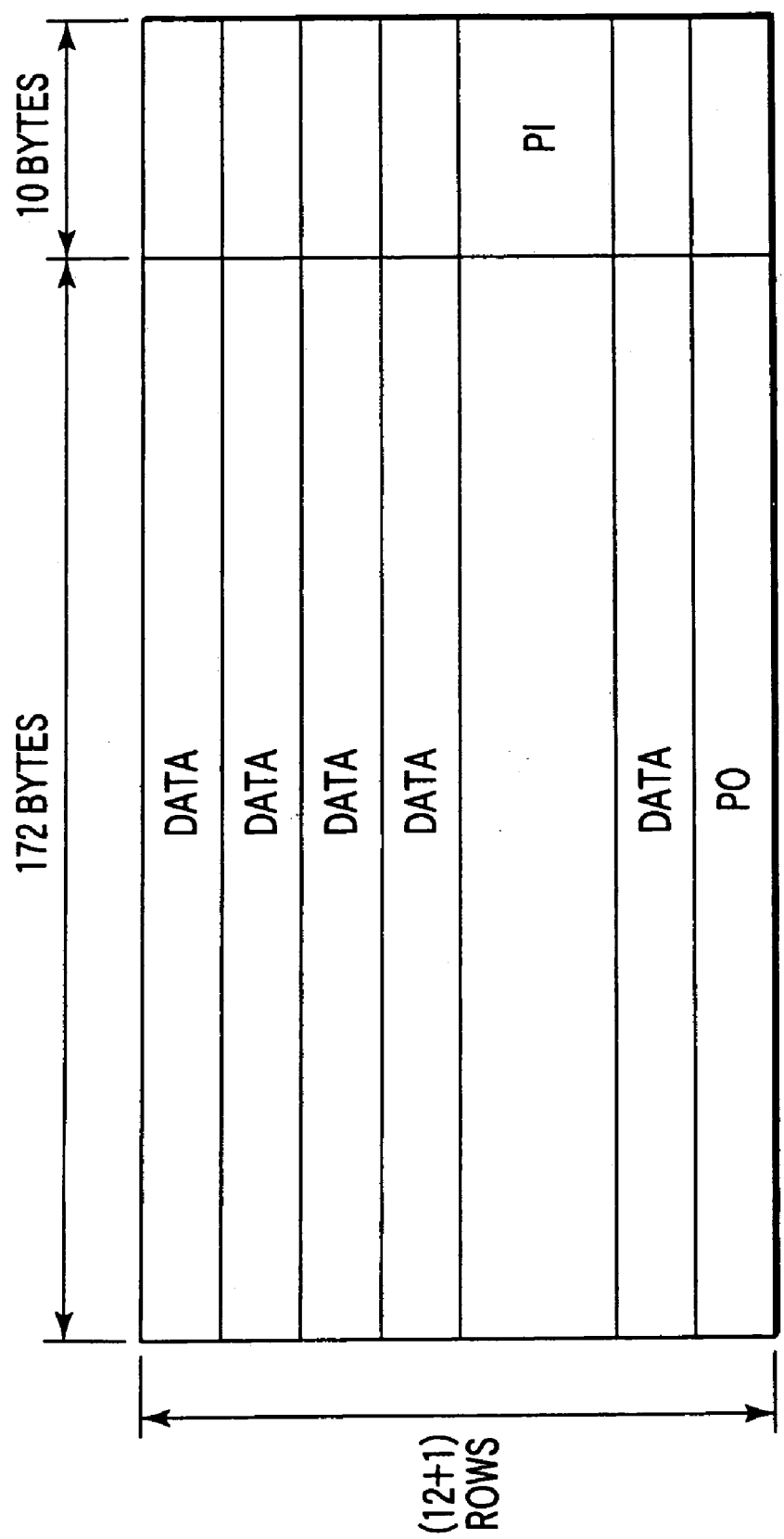
FIG. 6 is an explanatory view showing the constitution of a recording sector for use in the DVD system.

FIG. 6 shows the structure of a sector picked out from respective sectors after the outer-codes POs are interleaved. This is called a recording sector. (12+1) rows are provided because a part (a single row) of the outer-code parities POs is added to the sector (12 rows) shown in FIG. 2.

Figure 7:
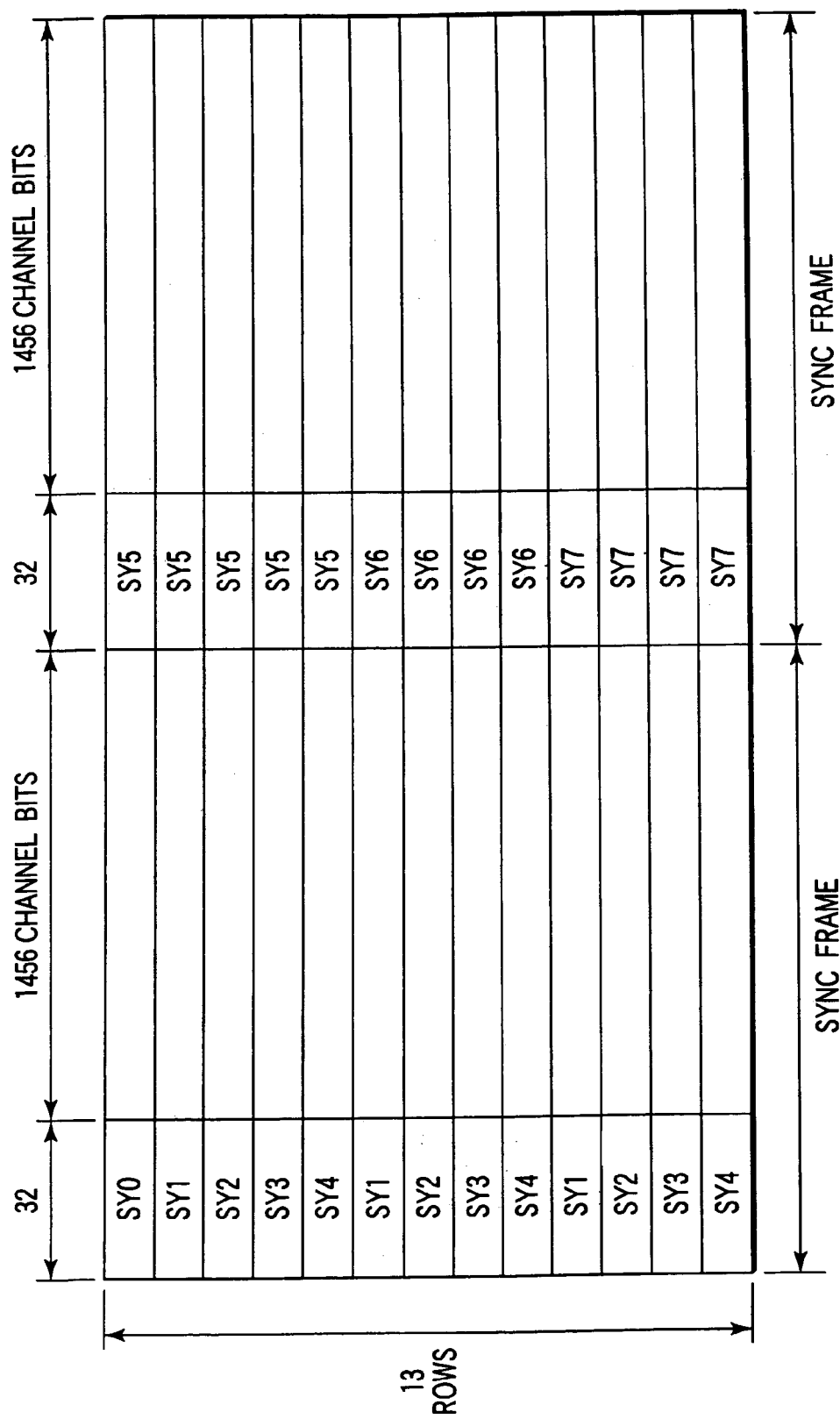
FIG. 7 is an explanatory view showing the constitution of a physical sector for use in the DVD system.

FIG. 7 shows the structure of a physical sector generated by passing data stream of each recording sector through a modulator.

The modulator code-modulates each data symbol (1 byte=8 bits) to 16 channel bits.

As shown in FIG. 7, a pair of sync frames of (32+1456) channel bits constructs a single row. For example, at the first row of FIG. 7, SY0 and SY5 are sync frames. Gathering 13 of such row constructs the physical sector.

As described above, in the DVD system, the data sector of 2 Kbytes is a unit of processing, the ECC block is constituted by a unit of 16 sectors, and the error correction code is added to the block. With this data structure, it is possible to manage the data by a unit of 2 Kbytes. Moreover, since the error correction code is added to the ECC block by the unit of 16 sectors, an error correction capability is enhanced.

In such a DVD, protection of information is carried out for video signals to be recorded in a ROM disc by a copyright protection system specialized in reproduction. In this case, a copy protection system called a content scramble system (CSS) is employed as the copyright protection system. However, the copy protection system is not a complete system. If the total data of a disc is backed up and restored, such a high level control as "check-in" processing cannot be carried out.

Figure 8:
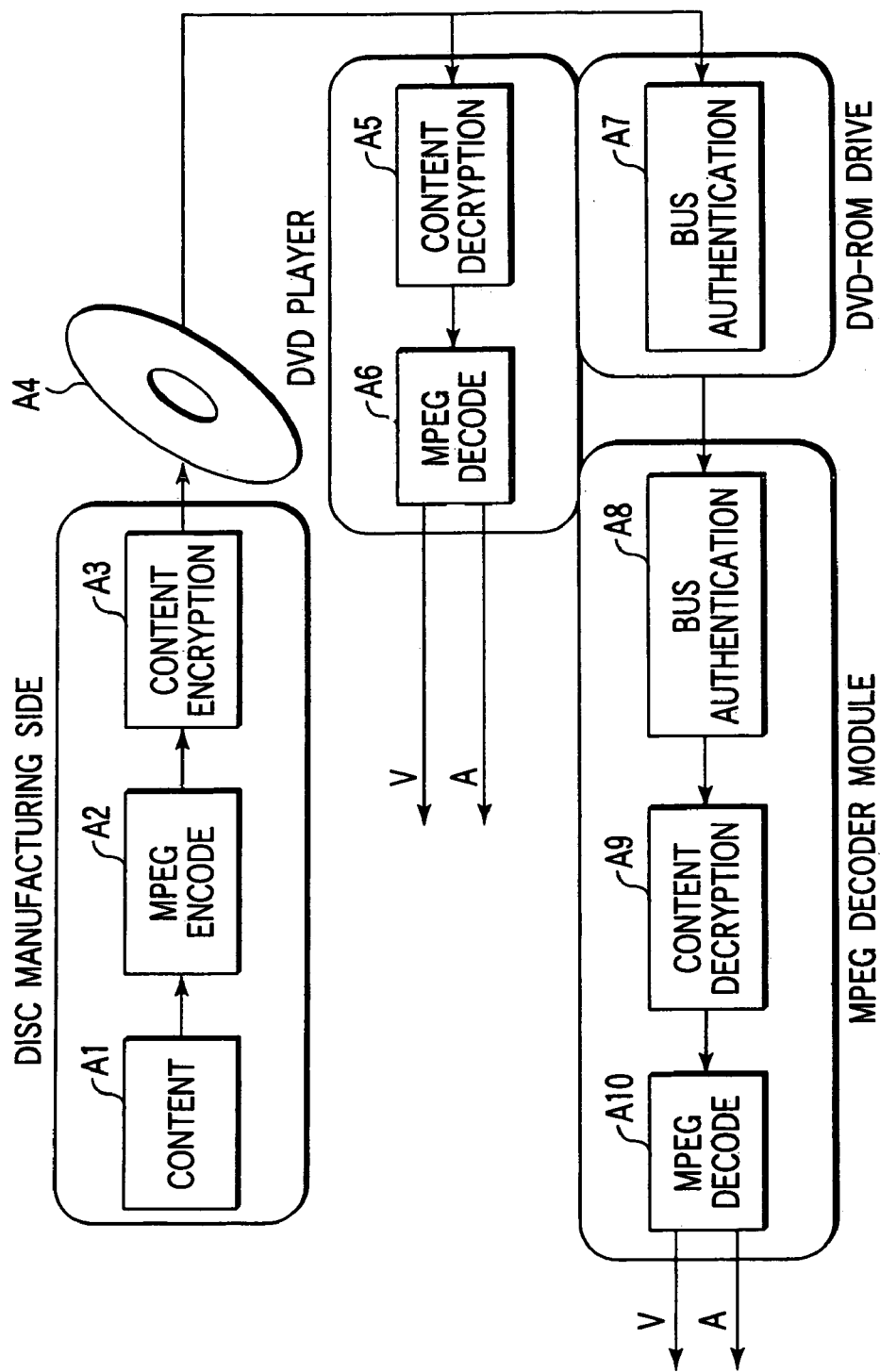
FIG. 8 is a schematic view of a content scramble system (CSS) for a copyright protection system of a DVD-video signal for use in a read-only medium of DVD standards.

FIG. 8 is a schematic diagram of the copyright protection system CSS (Content Scramble System) of a DVD-video signal used for reproduction dedicated media of the DVD standard.

At the side of disc recording, the digital content is MPEG-encoded, and encrypted by the CSS system, and recorded on a read-only medium (steps A1, A2, A3 and A4). Reproduction processing for this medium, at a general DVD dedicated player (a consumer appliance), the encrypted contents are decrypted (step A5), and the compressed data is expanded by an MPEG decoder or the like (step A6), and it is reproduced as a video/audio signal.

In a reproduction processing in a computer environment of a personal computer or the like, the digital data from the above-described medium is reproduced by a DVD-ROM drive (step A7). The read digital data is not transmitted as is on a PC bus. First of all, MPEG decoder module and authentication mutual identification (bus authentication) are carried out (steps A7 and A8). Further, this is a system in which the encrypted contents are transferred to only a proper decoder module. In this case, the data is transferred from the DVD-ROM drive to the decoding section, and the encrypted contents are decrypted (step A9). The compressed data is expanded by the MPEG decoder or the like (step A10), and it is reproduced as the video/audio signal.

Figure 10:
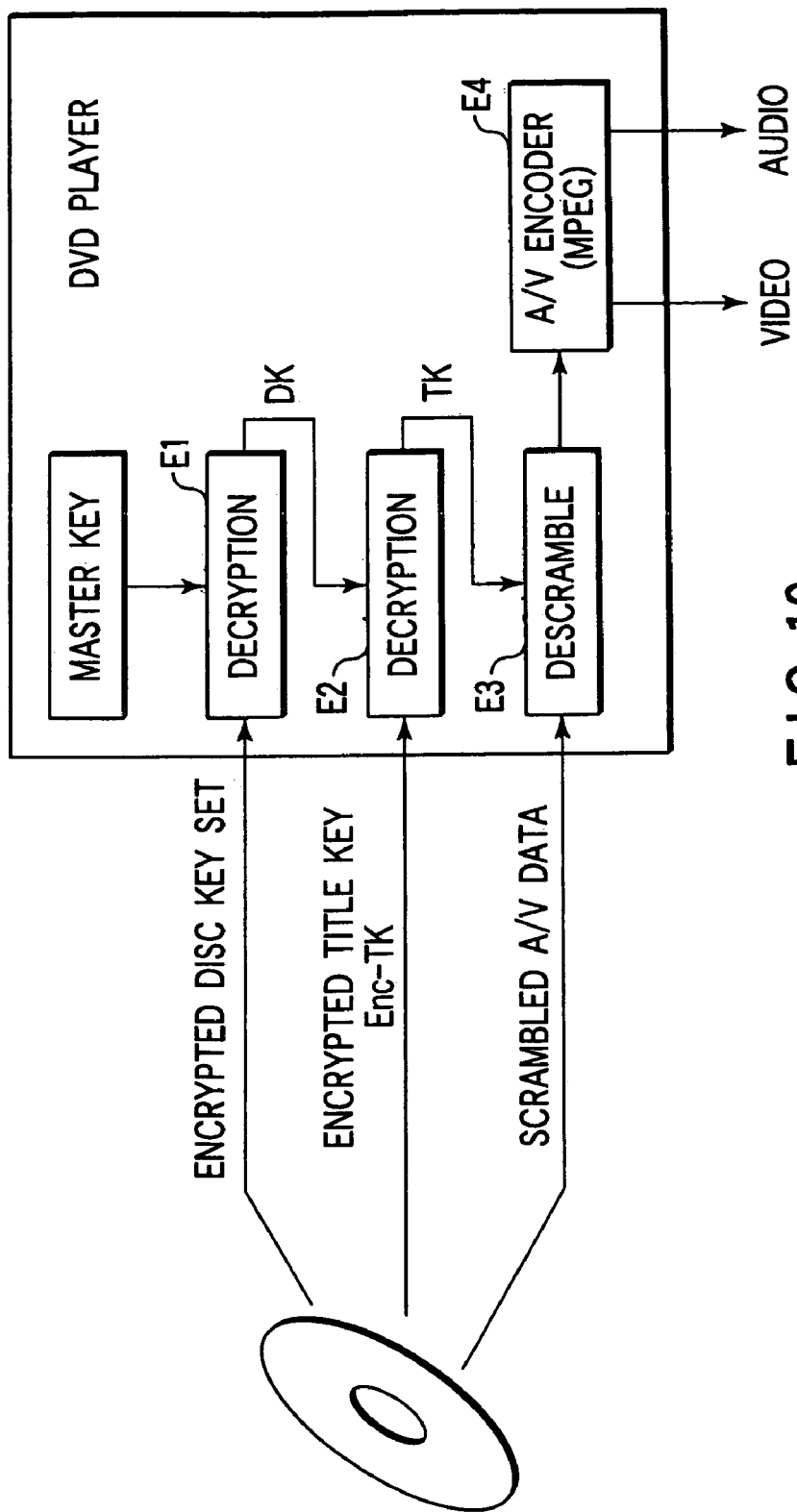
FIG. 10 is a schematic explanatory view of a DVD player.

FIG. 10 is a schematic diagram of a content encoding method of the CSS.

Three encryption key data, namely, a master key which the CSS management mechanism holds, and a disc key and a title key which a copyright holder or the like determine, are hierarchically combined, and data of video and audio are encrypted by the encryption key.

Figure 9:
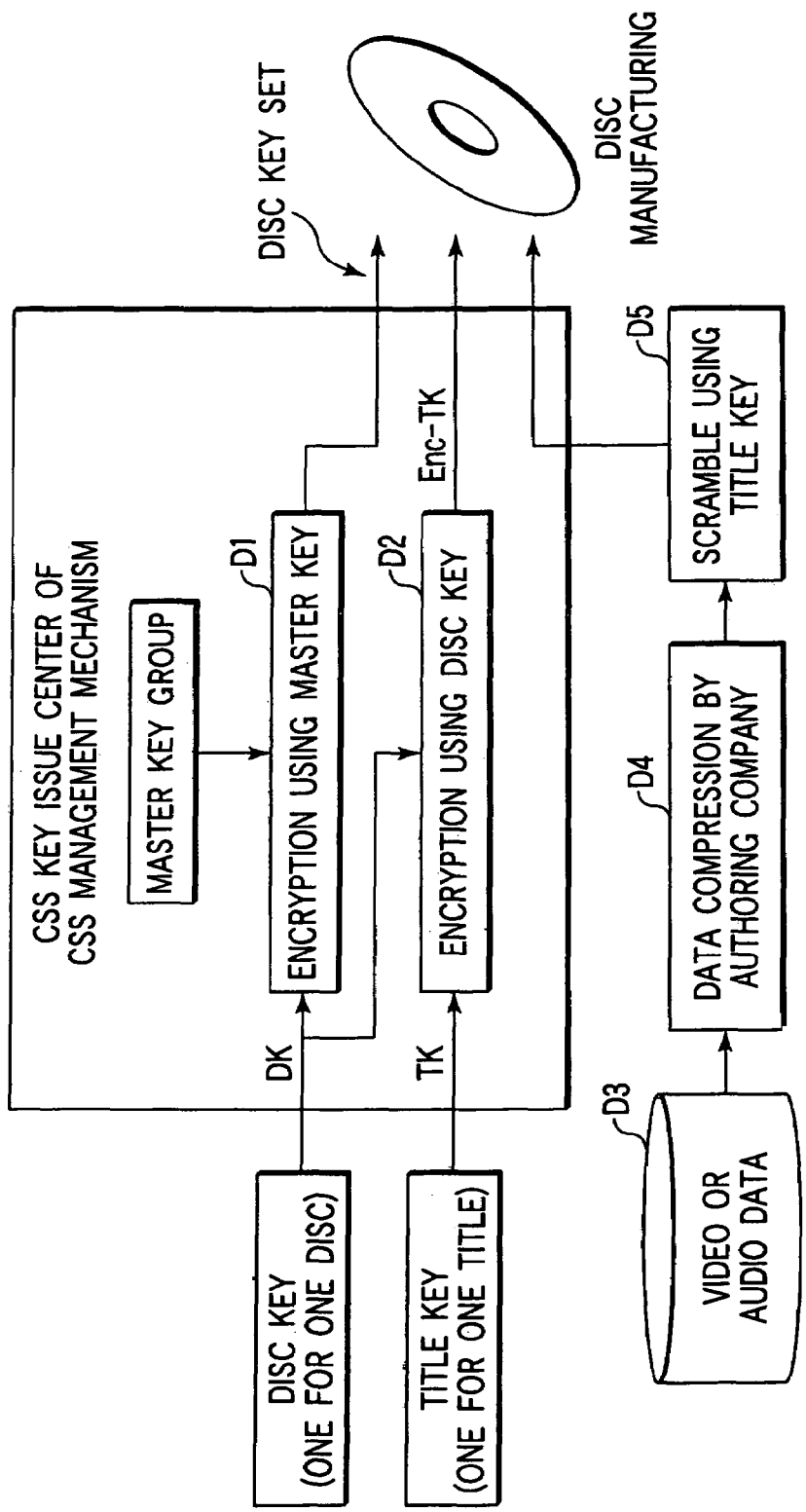
FIG. 9 is an explanatory view of the copyright protection system in the DVD system.

In the example of FIG. 9, the disc key is encrypted by using the master key (block D1), and it becomes a disc key block. The title key is encrypted by using the disc key by the encrypting section (block D2), and it becomes an encrypted title key. A content such as image data, audio data, and the like from a content section (D3) is compression-processed by a compression processing section (block D4), and the compressed data is scrambled by a scrambling section (block D5).

The master key is an encryption key data that is different for each manufacturer of a decryption LSI or a software CSS module.

The CSS management mechanism collectively holds the master keys of a large number of manufacturers. When the disc key is encrypted, a disc key block which can basically be decrypted by any of the master keys is prepared, and the disc key block is stored on a disc. Thus, damage when information of a master key given to a manufacturer leaks can be kept to a minimum.

Concretely, a next time when preparing a disc key block, the disc key block is prepared without the leaked master key. Thereafter, decrypting by using the leaked master key cannot be carried out.

FIG. 10 is a schematic diagram of content decryption in the DVD player reproducing a disc on which the encrypted content prepared in FIG. 9 is recorded. The encrypted "disc key block" is read from the disc, and the disc key is decrypted by using the master key by a decrypting section (block E1). The encrypted title key is read from the disc in the same way the encrypted title key is decrypted by the above-described decrypted disc key at decrypting section E2. Furthermore, scrambled "A/V data", which is the content, is descrambled by using the decrypted title key at descrambling section E3. The descrambled content is reproduced as the video/audio signal by an A/V decoder (block E4) such as an MPEG-2 decoder or the like.

The outline of the copyright protection system using the CSS method for a read-only medium has been described above. To perform the copyright protection, the content is encrypted by the scramble processing in this manner. Moreover, in the reproduction system, for the decryption of the encrypted content, the content cannot be decrypted until the encrypted key is decrypted. The copyright protection is thus performed.

In the read-only DVD system, since the recording side is processed in an edition operation by the reproduction of the master disc, the copyright protection is easily managed. However, in the DVD system in which the recording/reproducing is possible, a recording processing section exists in many apparatuses. Therefore, there is a possibility that an illegal apparatus capable of illegally copying the content is manufactured and a large number of content recording media are prepared by illegal copy.

Figure 11:
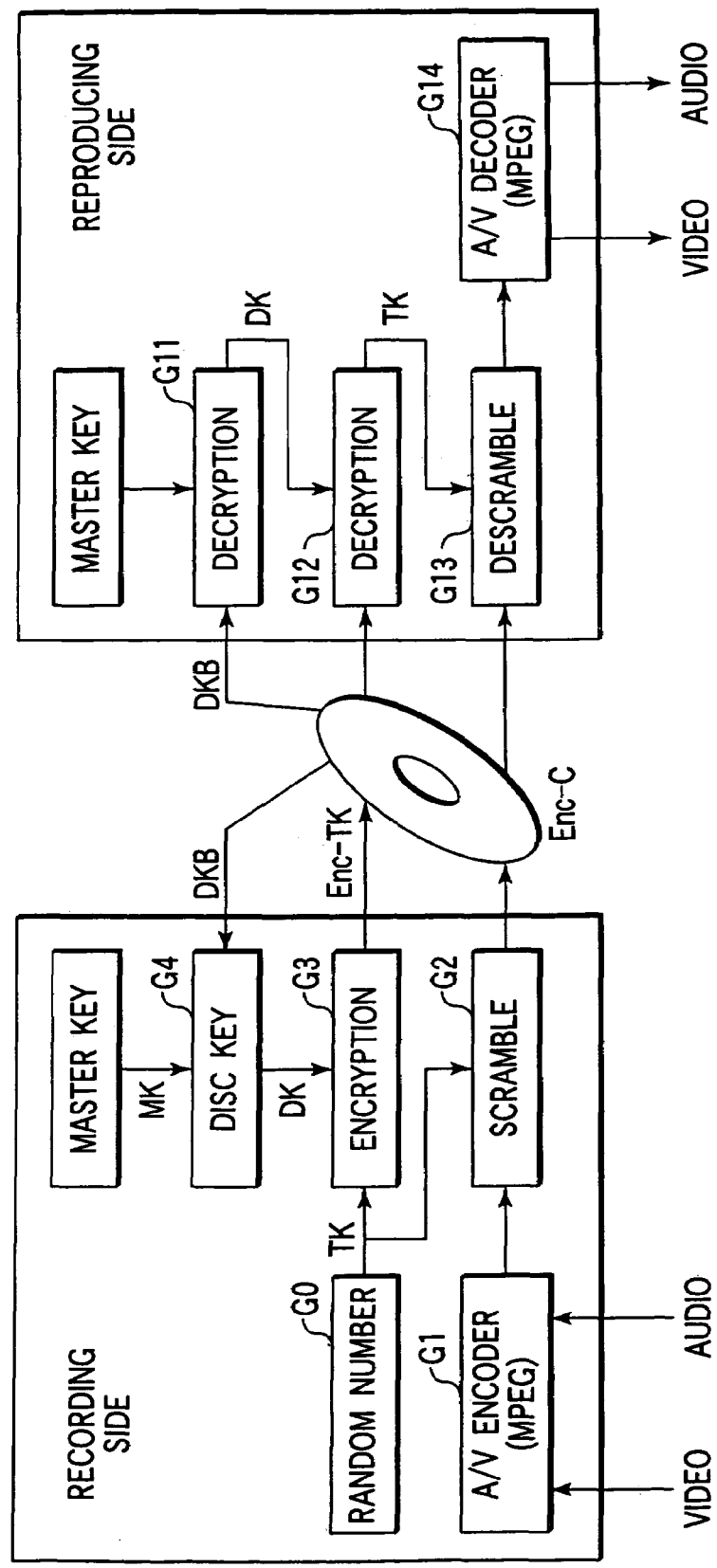
FIG. 11 is an explanatory view of the copyright protection system in a recording/reproducing apparatus.

FIG. 11 shows the structure of the copyright protection system in a recording/reproduction device. A recording section comprises a random number generating device G0, A/V encoding section G1, scrambling section G2, an encrypting section G3, and disc key processing section G4. A reproduction section comprises decryption sections G11, G12, descramble section G13, and A/V decoder section G14.

The audio(A)/video(V) content is encrypted by scrambling processing by using a title key TK generated in the random number generating device as a key (blocks G0, G1 and G2). On the other hand, the title key TK is encrypted by a disc key DK, and is recorded as an encrypted title key Enc-TK on a disc (block G3). The disc key DK is data obtained by reading a disc key block (or a disc key block)

DKB from the medium and decrypting the disc key block DKB by the master key MK in the same way as the disc key in the reproduction dedicated device (block G4).

A bundle of disc keys, in which the disc key is encrypted by a number of the master keys MKs, is recorded on the medium in advance. The disc key DK is decrypted and extracted therefrom by the master key MK embedded by the recording/reproduction device, and is utilized as the encrypted key of the master key MK.

On the reproducing side, the disc key block DKB is read out of the disc, and decrypted with the master key MK, so that the disc key DK is obtained (decryption section G11). The disc key DK is used to decrypt the encrypted title key Enc-TK read from the disc (decryption section G12). Subsequently, the title key TK is used to descramble the encrypted content read from the disc (descramble section G13). The decrypted content is decoded by the A/V decoder (decoder G14).

Figure 12:
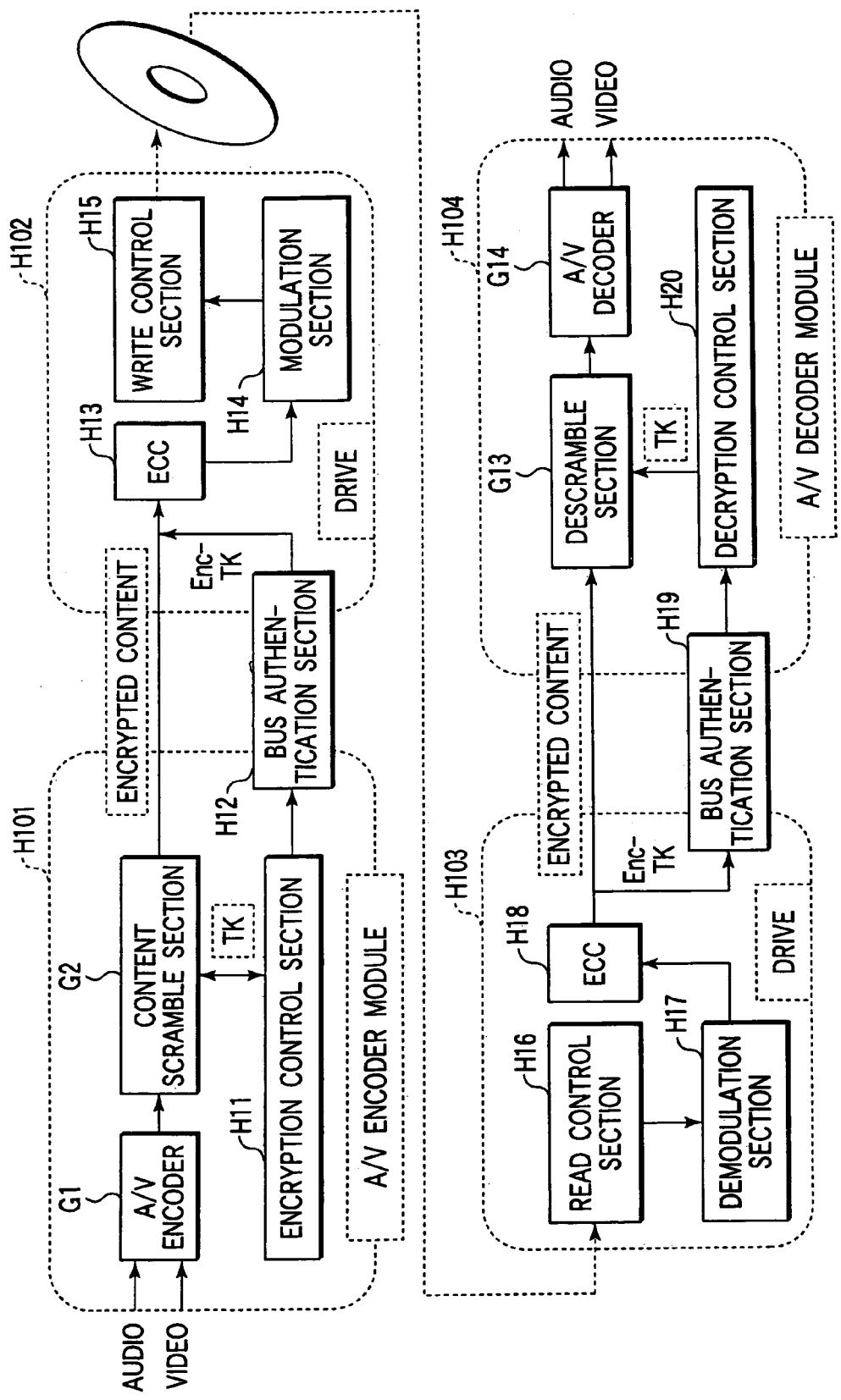
FIG. 12 is a whole explanatory view of the recording/reproducing apparatus.

FIG. 12 is a block diagram of the schematic structure of the recording/reproduction device. In a dedicated recorder in a general consumer environment, illegal copying is rarely supposed. However, in a PC (personal computer) environment, it is easily possible to copy data read by a drive onto another recording medium.

In a PC environment, a recording medium is regarded as a peripheral device. At the input/output of the drive in FIG. 12, recording/reproduction operation is generally carried out with no concern to the contents of the data. Therefore, the data on a data transmission/reception bus may be illegally transferred. To prevent this illegal transfer of data, it is necessary to use a bus authentication system.

FIG. 12 shows an AV encoder module H101 and drive H102 on the recording side, and a drive H103 and AV decoder module H104 on the reproducing side.

The components corresponding to those of FIG. 11 are denoted with the same reference numerals. In the AV encoder module H101, an encryption control section H11 corresponds to random number generation apparatus G0, disc key processing section G4, and encryption section G3 of FIG. 11.

At the recording side, the title key TK which is an encryption key is encrypted by a disc key DK and made to be the encrypted title key Enc-TK. When the encrypted title key Enc-TK is to be transferred to a drive, it is necessary to transfer it through a bus authentication processing H12. In other processings, processings which are substantially the same as the respective processings in the CSS are carried out.

In FIG. 12, the A/V encoder G1 and the content scrambling section G2 are provided in an A/V encoder module H101 at the recording side. An encode control section H11 corresponds to the random number generating device G0, encrypting section G3, and disc key processing section G4 of FIG. 11.

At the drive H102, ECC encoding by an ECC encoding section H13, modulating processing by a modulator H14, and writing processing onto a medium by a writing processing section H15 are executed.

At the reproducing side, at the drive H103, signal reading from the medium by a signal reading section H16, demodulation processing by a demodulator H17, and decoding by an ECC decoding section H18 are carried out. Furthermore, at a time of reproduction, mutual authentication by a bus authentication section H19 is executed between the drive H103 and the A/V decoder module H104. After confirming the mutual authentication, the output of the ECC decoder H18 is descrambled by a descrambling section G13, and decoded by an A/V decoder G14. A decode control section H20 corresponds to the disc key processing section E1, decrypting section E2, and descrambling section E3 in FIG. 11.

As described above, in the copyright protection system, the content is encrypted, and an encryption key is encrypted and the encrypted key is recorded in the recording medium (disc). However, in this system, the encrypted content and encrypted key are opened digital signals in transmission, reception, recording, and reproducing paths.

The copy protection method using the encrypting technique described above effectively functions in a DVD-video disc or a DVD-ROM disc on which previously encrypted information is recorded. However, in the case of a DVD-RAM or the like on which users can newly record information, the following problems arise.

(1) In a recording device that general users utilize, it is difficult to introduce a strong and low-priced encrypting device.

(2) It is difficult to manage an encryption key at the time of encryption. When encrypting and decrypting are carried out at the information recording device side, there is a high possibility that copying of information, for which copy protection is desired, can be easily carried out.

(3) If the encrypted content and encrypted key are copied as a whole, an illegal disc which can be reproduced by a regular device is made (when there is no concealed region).

(4) When an audio signal is processed, it must be processed in units of a large number of files (compositions). Therefore, it is difficult to maintain a copyright protection function for a request to manage in file units.

(5) As described above, it is difficult for a conventional encrypting technique to, as it is, effectively function in the copy protection of digital information signals. When encrypted recording information is reproduced, decrypting processing is carried out in the reproduction processing, and depending on the processing of the decrypted digital signal, the possibility of illegal copying still remains. In particular, by copying the encrypted information and the encrypted key as a whole, there is the possibility that a large quantity of copied recording media can be prepared.

As in the case of the DVDs, if various types of media such as read-only DVD-ROMs, and recordable DVD-Rs, DVD-RWs, and DVD-RAMs or the like are present, it is difficult to distinguish whether the digital signal recorded on the recording medium is an original signal or an illegally copied digital signal.

With respect to this problem, a similar problem arises in other recording media. Therefore, from the standpoint of copyright protection, it is desirable that information signals are encrypted such that only correct systems can decrypt, and it is determined whether the input digital signal is an original digital signal or an illegally copied signal at the entrance of the reproducing side. If a portion of the protection system is built in a region which general users cannot process, the ability of copyright protection can be largely improved.

That is, in the conventional copyright protection system, the transmission/reception or the recording/reproducing is performed by open data processing method. Moreover, means for encrypting the content constitutes the protection system. Therefore, there is a possibility of occurrence of an illegal action such as the copying of the encrypted data as it is. To prevent such illegal action, the concealment information region including the specific data needs to be secured in a part of the recording medium or a part of the transmitted/received information.

A similar technique in which the concealment information region is arranged in a part of data is described in Jpn. Pat. Appln. KOKAI Publication No. 11-86436. This technique comprises embedding the specific data in the data block with the error correction code added thereto. After the error correction of the data block, the specific data is corrected as an error. Therefore, after the error correction, the specific data disappears from the data block. The specific data can be extracted before the error correction.

As a result, if only the data subjected to the error correction is transferred to the outside, the specific data can be detected only in the drive, and the specific data can be used to enhance a copyright protection capability. That is, it is possible to use the specific data in distinguishing the control signal of the copyright protection such as the original signal and illegal copy signal. Since the specific data is replaced as an error signal in this method, the information is not included in the reproduced digital signal. Moreover, correction processing is not performed by the general user who operates the system apparatus, and is therefore suitable for detecting the illegal operation. The specific data detected by this method can be an electronic watermark which disappears. When the original digital signal is subjected to the correction processing, the specific data disappears. When the presence/absence of the specific data is verified, the original signal or an illegal copy signal can effectively be distinguished.

However, in this method, when the specific data is added to main data, the main data is destroyed. Therefore, on a side on which the main data is demodulated and reproduced, the presence of the specific data undesirably increases the error.

[II] Noted Respects

A method of embedding and recording the specific data in the data block with the error correction code added thereto is described in publications other than Jpn. Pat. Appln. KOKAI Publication No. 11-86436. However, in any case in which the specific data is embedded, the main data is destroyed. However, in the present invention, the error correction is prevented from becoming impossible.

The constitution of the copyright protection system in the recording/reproduction apparatus according to the present invention will be next described.

In the present invention, the concealment information region is constructed in the data block with the error correction code added thereto. When the concealment information region is constructed, the main data is multiplexed/arranged. Even when the main data is destroyed by the specific data, a basic error correction capability is secured.

An example of the copyright protection system will concretely be described hereinafter. Moreover, it is assumed that the method of encrypting the content is a method for use in the DVD system in the description.

Figure 13:
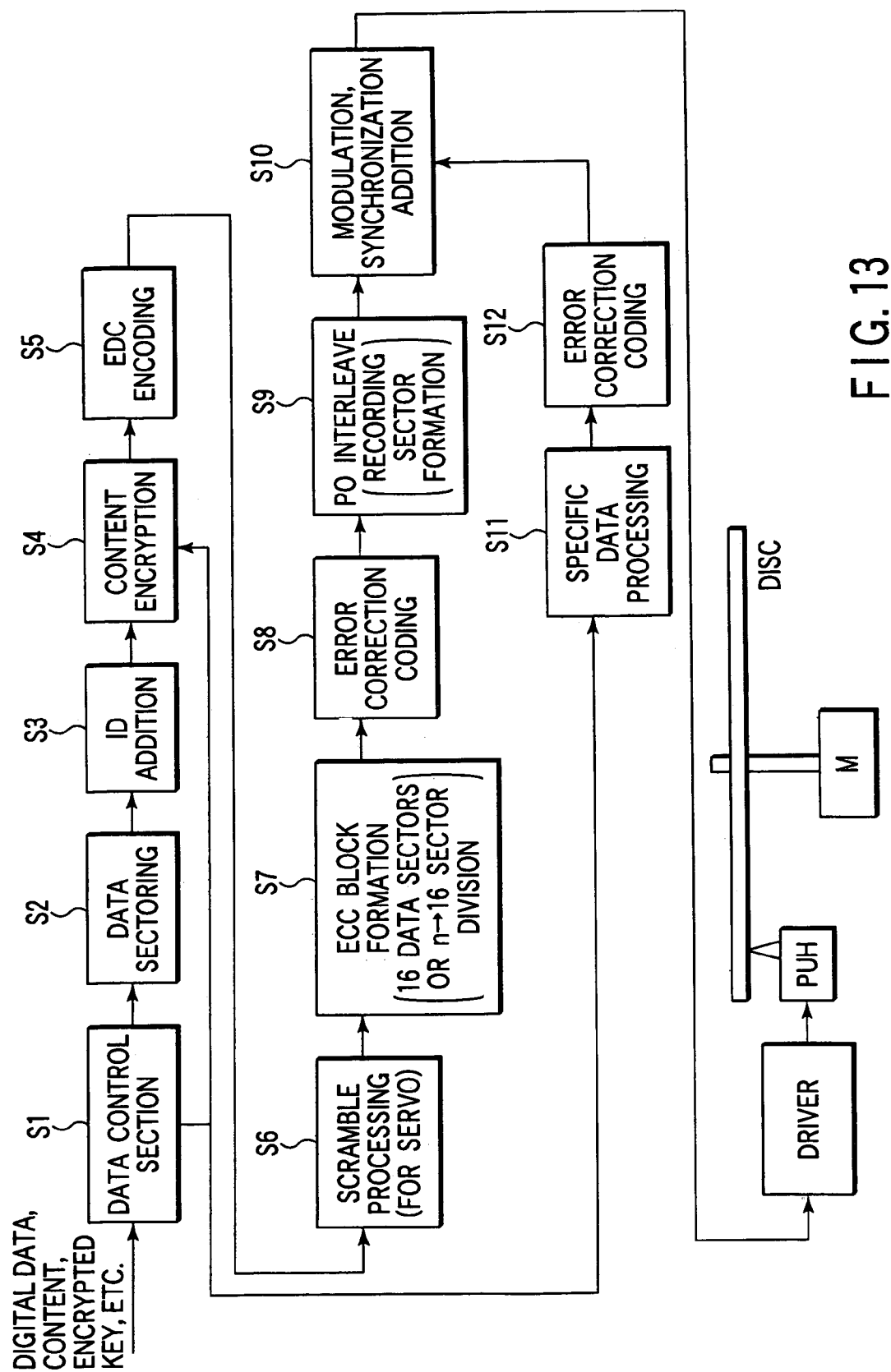
FIG. 13 is a constitution explanatory view of a recording apparatus according to an embodiment of the present invention.

In FIG. 13, the video/audio information signal is compressed by the MPEG method, and further formatted in a digital data stream to which a reproduction control signal is added (data control section S1).

The digital data is divided into the packet data by a unit of 2 Kbytes (sector formation section S2). The sector numbers such as ID are added (ID addition section S3). To protect the copyright, the data is encrypted or scrambled (contents encryption section S4). The error detection code EDC is added to the encrypted data (EDC processing section S5).

Thereafter, for a purpose of stabilizing the servo system in the reproduction operation, the data portion is data-scrambled with the random signal generated by the initial value determined by the ID information (scramble section S6).

Here, different from the above-described data scramble for the encryption, in this data scramble, the data is scrambled with the open content. For the purpose, when the digital data is all "0", the recording data becomes the repetition of the same pattern. In this case, there is a fear of occurrence of the problem that the tracking servo error signal cannot accurately be detected by the crosstalk of the adjacent track in the disc system. To execute the data scramble, the initial value of the M series generator is determined by the ID value. The signal from the M series generator is multiplied by the digital data, and the data scramble is performed. This prevents the data-scrambled recording signal from becoming the repetition of the same pattern. The data scramble for use in stabilizing the servo has been described only above. The data scramble described in the separate paragraph is used in the encryption processing for protecting the copyright of information.

The digital data subjected to the above-described processing is formed into the error correction code (ECC) block for the error correction processing by a unit of 16 sectors (ECC block formation section S7). Here, the error correction codes of the inner-code parity PI and outer-code parity PO are generated (error correction code generation section S8).

The outer-code parity PO is scattered/arranged into each sector and the recording sector is constituted by the interleave processing (PO interleave section S9). The recording sector data is modulated by the modulation circuit (modulation/synchronization addition section S10). The modulated signal is recorded in the disc via the driver and optical pickup head (PUH).

In a series of processing steps as described above, actual audio/video data is a large aggregate of the data sector as the A/V data file. The file management data and other control signals for managing the contents data are separated from the contents data and stored in the file. The encryption key of the content is encrypted and the encrypted key is similarly stored in the file. The encrypted keys of a plurality of files (content data files) may be collected and recorded in a specific place on the disc.

In the above-described system, the control data from the data control section S1 is supplied to a specific data processing section Sl1. Here, the specific data is generated, and subsequently subjected to an error correction coding processing in an error correction coding section S12. The specific data subjected to the error correction coding processing is supplied to the modulation/synchronization addition section S10.

Examples of the above-described specific data include an encrypted key Enc-TK for encrypting/decrypting the content. In the copyright protection system, for example, a music content for several tens to hundreds of pieces of music is recorded in one recording medium (e.g., the disc). In this case, if a plurality of keys are collected and recorded in a specific place on the medium, the keys are used to realize a valid/invalid processing (setting) with respect to some pieces of music. That is, encryption or non-encryption can be set with respect to each piece of music. Thereby, the recording processing into the recording/reproducing media can efficiently be performed.

For the encrypted key Enc-TK, it is assumed that a data length of one key is 8 bytes. Then, even when the encryption keys of the contents for 1000 pieces of music are prepared, the capacity of the plurality of encryption keys is 8 Kbytes.

The ECC block of the DVD system is constituted of 32 Kbytes (16 sectors), and 8 Kbytes is ¼ of the capacity.

Here, it is preferable that the data is completely stored in the ECC block. Then, with the content encryption key of 8 Kbytes (2 K data sectors×4), 8 Kbytes×4=32 Kbytes if it is multiplexed in four times, and the ECC block of 16 sectors is constituted. That is, when the encrypted keys are multiplexed/arranged, the ECC block can be constructed. The section which performs this processing is the above-described specific data processing section S11.

As described above, the error correction code is generated and added to the ECC block data in which the encrypted keys are multiplexed/arranged, and the recording sector is generated. Subsequently, a synchronous signal addition/modulation processing is performed and the signal is recorded in the disc. The section which performs this processing is the error correction coding section S12 and modulation/synchronization addition section S10.

Here, to protect the system from a person who attempts to illegally circumvent the copyright protection system and to enhance the system capability, the concealment information region for recording the specific data which cannot be handled by the general user is set in the data region of the disc. When the concealment information is prepared, the ECC block with the data multiplexed/arranged therein is used.

That is, in the present embodiment, a part of the ECC block is changed to the specific data, and the ECC block including this specific data is modulated and recorded in the disc. Additionally, in this case, even when the specific data is included, an error ratio of the ECC block is prevented from being deteriorated.

Figure 14:
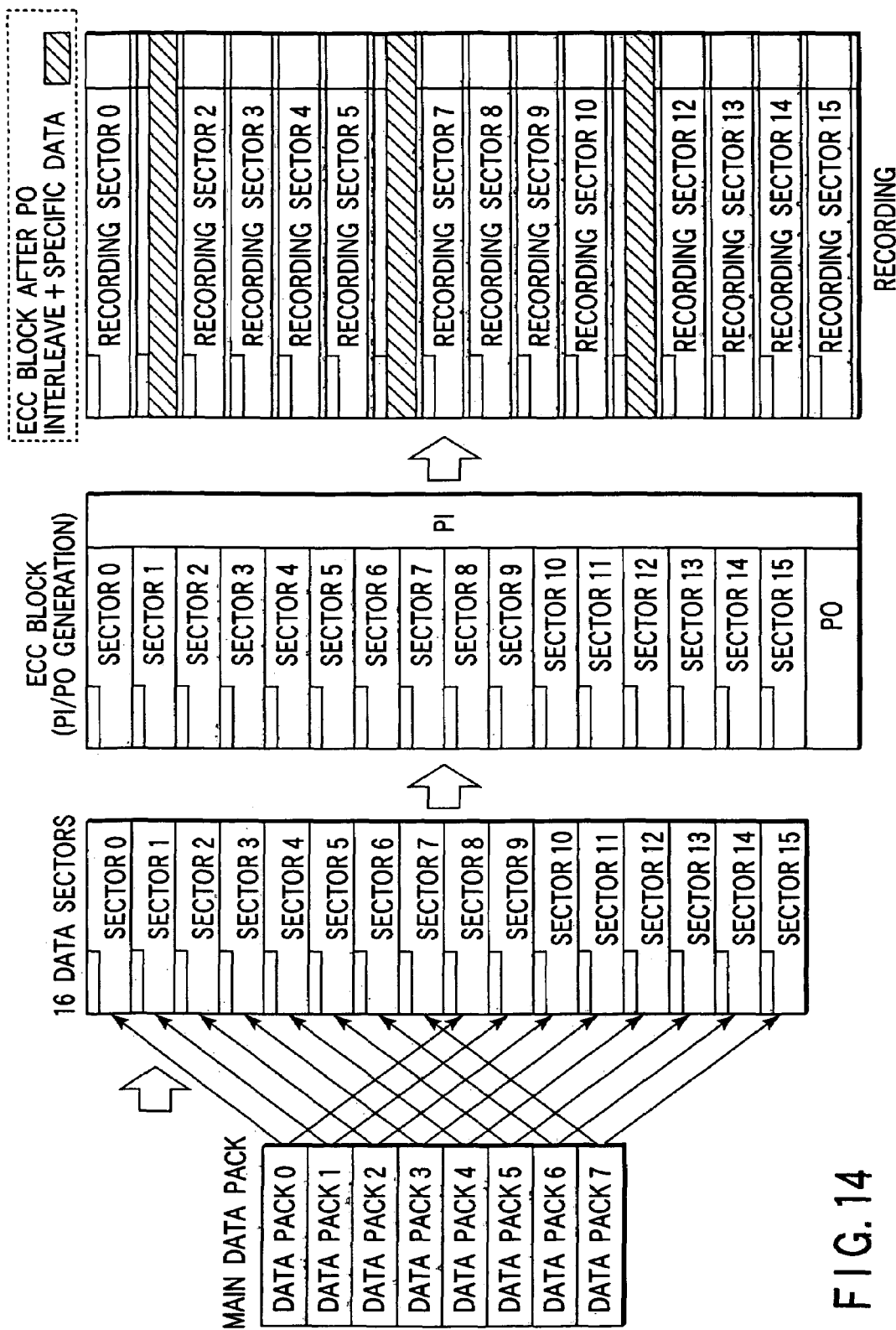
FIG. 14 is an explanatory view showing one example of an embedded place of specific data.

FIG. 14 is an explanatory view showing one concrete example of an embedded place of the specific data. Data packs 0 to 7 each of 2 Kbytes are multiplexed/arranged in 16 data sectors. In this case, a data pack 0 is arranged in sectors 0 and 8, data pack 1 is arranged in sectors 1 and 9, data pack 2 is arranged in sectors 2 and 10, data pack 3 is arranged in sectors 3 and 11, data pack 4 is arranged in sectors 4 and 12, data pack 5 is arranged in sectors 5 and 13, data pack 6 is arranged in sectors 6 and 14, and data pack 7 is arranged in sectors 7 and 15.

Here, the error correction codes of the outer-code parity PO and inner-code parity PI are generated with respect to the block in which 16 sectors are assembled. Subsequently, the outer-code parity PO is scattered/arranged by the interleave processing and thereby the recording sectors are constituted.

Thereafter, the sectors 1, 6, 11 excluding the rows in which the sector numbers are recorded and PO rows are used as the concealment information region. The specific data having its own error correction code exists in the region.

According to this arrangement structure, when the error correction processing is performed in the reproduction, and the original main data of the sector 1 is reproduced, the main data of the sector 9 is copied and used, and the data destroyed by the specific data can be restored. Additionally, needless to say, the specific data is extracted beforehand in the specific data reproduction.

Similarly, when the original main data of the sector 6 is reproduced, the main data of the sector 14 is copied and used, and thereby the data destroyed by the specific data can be restored. Moreover, when the original main data of the sector 11 is reproduced, the main data of the sector 15 is copied and used, and thereby the data destroyed by the specific data can be restored.

Therefore, according to this method, the specific data can be embedded in the ECC block without increasing the error ratio of the main data. Additionally, when the specific data is reproduced, the place (sector) with the specific data embedded therein is known beforehand from the ECC block, and the specific data is taken into the demodulation section and demodulated beforehand.

Figure 15:
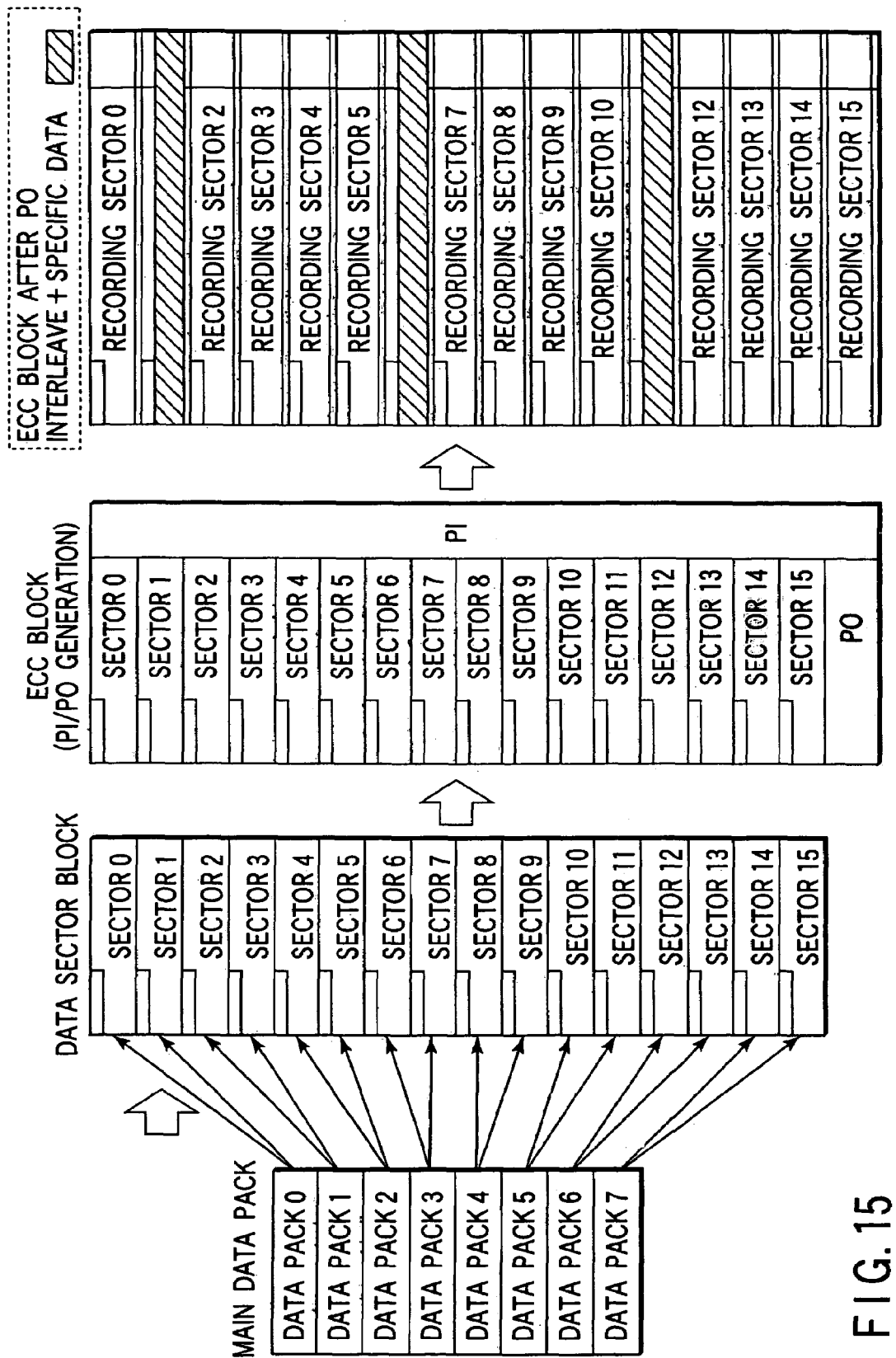
FIG. 15 is an explanatory view showing another example of an embedded place of specific data.

FIG. 15 shows another example of the embedded place of the specific data. In this example, the data packs 0 to 7 each of 2 Kbytes are multiplexed/arranged in 16 data sectors. In this case, the data pack 0 is arranged in sectors 0 and 1, data pack 1 is arranged in sectors 2 and 3, data pack 2 is arranged in sectors 4 and 5, data pack 3 is arranged in sectors 6 and 7, data pack 4 is arranged in sectors 8 and 9, data pack 5 is arranged in sectors 10 and 11, data pack 6 is arranged in sectors 12 and 13, and data pack 7 is arranged in sectors 14 and 15.

Here, the error correction codes of the outer-code parity PO and inner-code parity PI are generated with respect to the block in which 16 sectors are assembled. Subsequently, the outer-code parity PO is scattered/arranged by the interleave processing and thereby the recording sectors are constituted.

Thereafter, the sectors 1, 6, 11 excluding the rows in which the sector numbers are arranged and PO rows are used as the concealment information region. The specific data having its own error correction code exists in the region. For the ECC block, the original data of the sector 1 can be reproduced from the data of the sector 0, the original data of the sector 6 can be reproduced from the data of the sector 7, and the original data of the sector 11 can be reproduced from the data of the sector 10.

Figure 18:
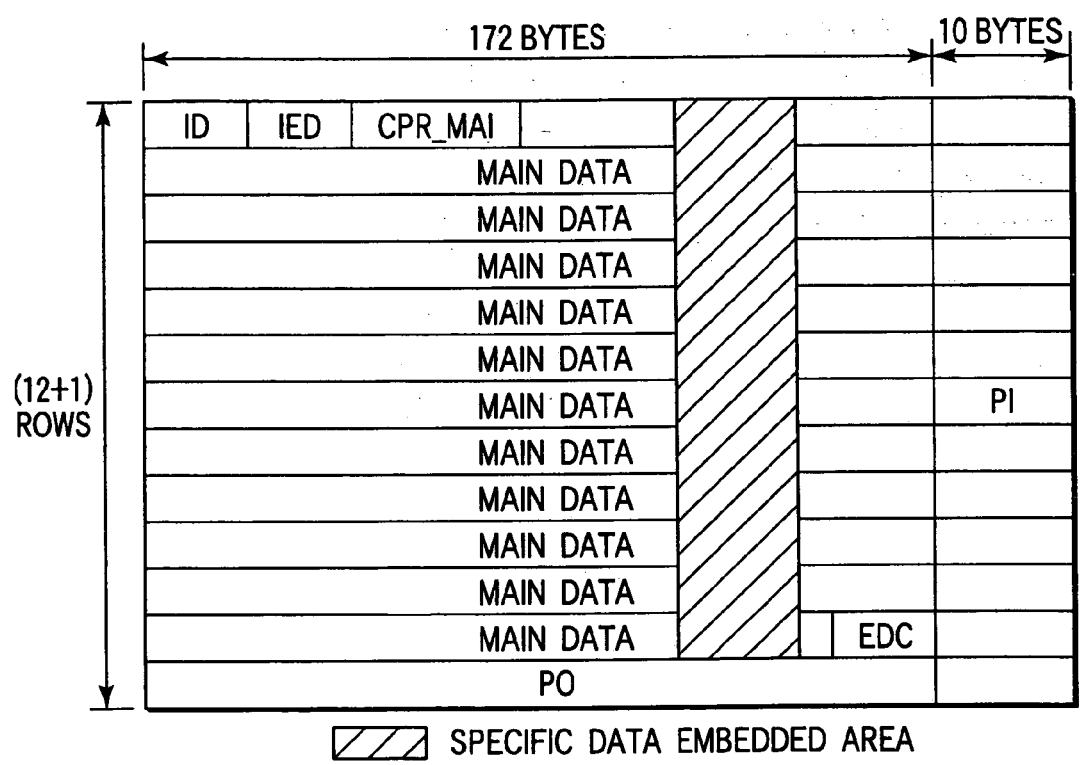
FIG. 18 is an explanatory view showing a still further example of an embedded place of specific data.

FIGS. 16, 17, and 18 show examples of the sector in which the specific data is embedded. In the example of FIG. 16, the specific data is arranged in the rows excluding the rows in which ID and PO are arranged. The row with the ID arranged therein is first used in a detection processing during seeking in the reproduction processing. If another data is embedded in this row, the system capability is deteriorated. Each sector ID is different in the ECC block. Therefore, even when the main data of the row with the ID of a certain sector arranged therein is the same as the main data with the ID of another sector arranged therein, the value of PI differs with the row as a result. When this row is used in the specific data embedded place, the error increases even with the data copy from another sector in the reproduction processing. However, this does not apply to a case in which only the main data region excluding ID and PI is used, and the case is not different from the object of the present invention. However, for the other rows, even the PI region can be used as the specific data embedded place. Therefore, the system is more easily constituted, when the rows are not used.

In the example of FIG. 17, the rows in which the specific data is to be embedded are scattered. In this example, the specific data is embedded every other row excluding the rows in which ID and PO are arranged. With this arrangement, the places in which errors are generated in the recording, reproducing, transmission, and reception processing can be scattered. Therefore, the correction capability of the specific data can be expected to be enhanced.

In the example of FIG. 18, the places in which the specific data is embedded are scattered/arranged in a column (longitudinal) direction. Additionally, in the examples of FIGS. 17, 18, the specific data embedded places in one sector are shown, but the specific data may of course be embedded over the plurality of sectors (see FIGS. 14, 15).

Figure 19:
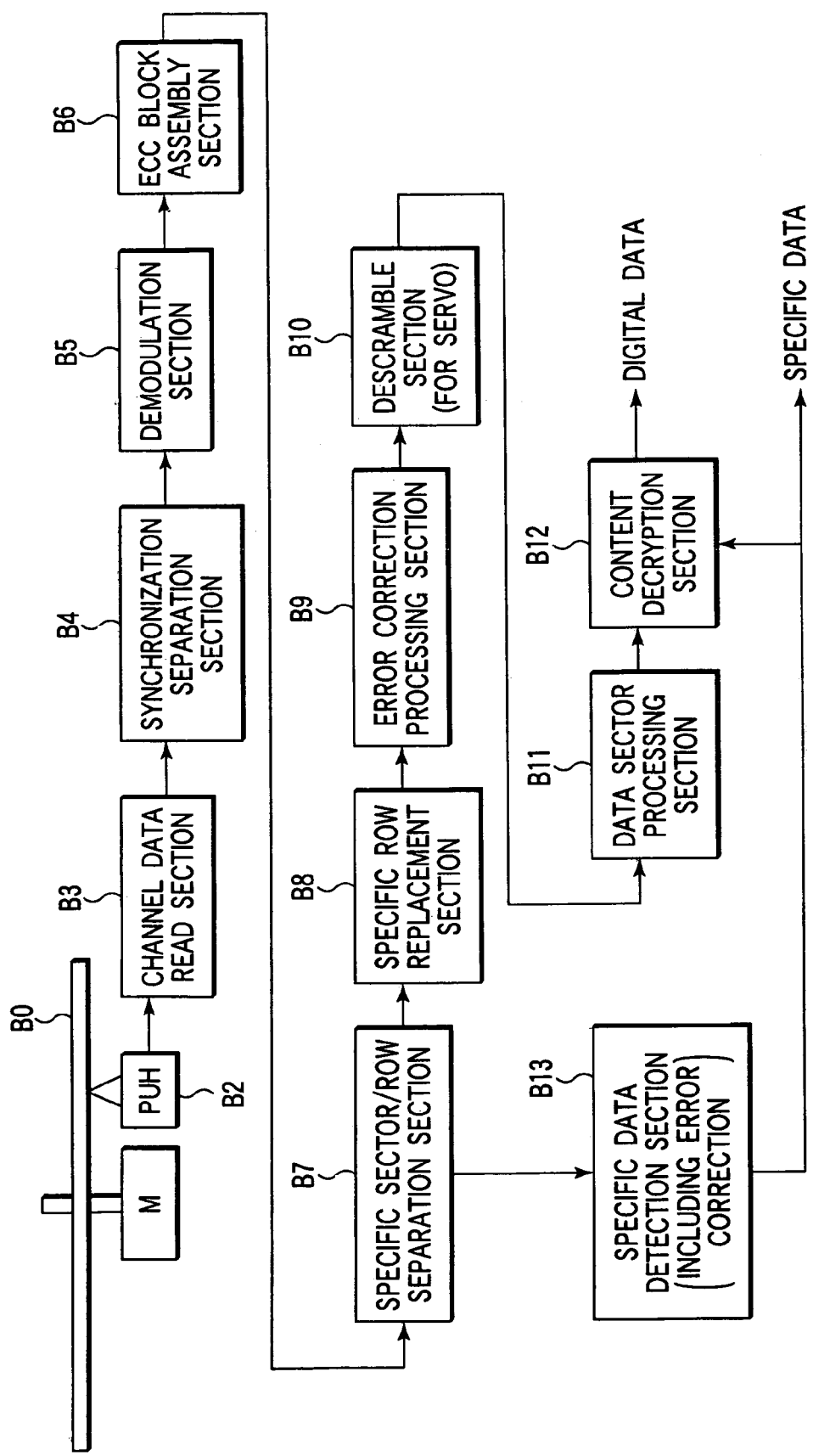
FIG. 19 is a constitution explanatory view of a reproducing apparatus according to an embodiment of the present invention.

FIG. 19 is a block diagram showing the reproducing apparatus according to the present invention. In FIG. 19, the recording signal of a disc B0 is read via an optical pickup head (PUH) B2. The read signal is amplified by a preamplifier, and binarized in a channel data read section B3, and channel data is extracted. A synchronization separation section B4 separates the synchronous signal from the extracted binarized signal, and subsequently demodulated by a demodulation section B5. For example, 16 bit data is demodulated into 8 bit data using a conversion table. This digital data is supplied to an ECC block assembly section B6 and constructed as the ECC block.

Subsequently, the ECC block is supplied to a specific sector and row separation section B7, and the specific data is extracted. The extracted specific data is supplied to a specific data detection section B13. Moreover, the ECC block is supplied to a specific row replacement section B8. Here, as described above with reference to FIGS. 14 to 18, the portions in which the specific data is embedded are replaced with normal sector or row data. Subsequently, the ECC block (having no specific data) is supplied to an error correction processing section B9, and subjected to an error correction processing.

The data subjected to the error correction processing is descrambled in a descramble section B10. The descrambled data is formed as the data pack (see FIGS. 14 and 15) in a data sector section B11, and subsequently decrypted by the specific data (title key TK) given from the specific data detection section B13.

That is, the content data is reproduced, and the encrypted content is decrypted by the specific data (encryption key, and the like) detected beforehand. For the decrypted data, the compressed signal is expanded by the MPEG decoder, and demodulated as a digital video signal. The audio data is similarly demodulated, and a final audio/video signal is reproduced.

FIG. 20 shows a flow of sector data in the reproducing apparatus. For the reproduced ECC block including the concealment region (state J1), first the data of the concealment region is separated (SP-Data0, SP-Data1, SP-Data2). By this separation, the main data row is copied from the sector in which the data to be inserted in a blank region is arranged, and inserted in the blank region in the ECC block (state J2). In the shown example, the data of the recording sector 9 is inserted in the sector 1, the data of the recording sector 14 is inserted in the sector 6, and the data of the recording sector 3 is inserted in the sector 11.

The ECC block constituted in this processing is subjected to the error correction processing (state J3). Subsequently, the final data pack is obtained (state J4). On the other hand, the specific data signal of the separated concealment region is subjected to the unique error correction processing, and the specific data is detected.

In the conventional example, a large file data such as the video/audio data is processed with the data pack by the specific capacity. However, in recent years, the error correction block in the data processing has been handled and processed by a relatively large capacity unit. In this processing, a part of the management data or content is constituted to be complete by the error correction block unit.

This property has been noted. In the present embodiment, when the unit of the management data or content is smaller than the capacity of a large error correction block, the management data or content is multiplexed/arranged (used a plurality of times), and the whole unit is formed in the capacity of the large error correction block. Moreover, the concealment region is set using a part (sector) of the block.

Therefore, with the construction of the concealment region with respect to the optical disc in which the data can be read from the whole recording region by a general-purpose recording/reproducing apparatus, the concealment region can be set in a part of the main data block. Even in this case, the error of the main data by the construction of the concealment region is not generated. Similarly, even when all transmission data is open in the transmission/reception system, it is possible to construct the concealment region in the transmission data without deteriorating the error ratio.

Effective respects of the present embodiment described above will be described hereinafter.

1. The concealment region for the specific data is secured in a part of the error correction coded block. Moreover, the part is replaced with the specific data, and transmitted or recorded. Here, for the block of the digital information, the replaced region forms the error data, and the error ratio is deteriorated. However, the error correction code is generated and added to the multiplexed/arranged data, it is possible to copy the original data to the specific data replaced portion before the correction processing from another region during the reproduction, and the error ratio is prevented from being deteriorated.

2. Since a product code is constituted as the error correction code by the outer-code and inner-code parities, an effect of multiplexing increases.

3. When the main data is multiplexed/arranged in a plurality of rows, for the portion of the data of the same content arranged in the row direction, code strings including the inner-code parities are constituted as the row having the same data content. As a result, even when some rows are destroyed by the specific data, the data of the destroyed row can be replaced with the data of the non-destroyed row.

4. The main data is multiplexed/arranged in a plurality of columns, the portions of the data of the same content arranged in a column direction are the same, and therefore the code string including the outer code is constituted as the column having the same data. As a result, even when some columns are destroyed by the specific data, the data of the destroyed column can be replaced with the data of the non-destroyed column.

5. A plurality of data sectors constitute one block. In the error correction coding processing, the data sectors are multiplexed/arranged, the error correction code is generated and added to the large block, and the error correction coded block is generated. Moreover, some data sectors are replaced with the specific data. As a result, the processing is possible by the sector unit.

6. When a plurality of sectors constitute the error correction coded block, the IDs of different sectors are set to be different. A multiplexing write processing is performed such that only the main data region overlaps with the data of another sector. Moreover, the place where the specific data is to be embedded is only the main data region. Then, in the reproduction processing, it is unnecessary to subject the ID portion to a special processing.

7. Since the error correction code is the product code, the multiplexed/arranged rows include the data of the same code string including the inner code, and an effect in a substitution processing increases during the reproduction processing.

8. In the reproduction processing, the main data of the row destroyed by the specific data is constituted so that the main data is replaced with the main data of another multiplexed/ written row and the correction processing is effectively performed. When the main data is replaced with the original main data content, the outer code corresponds to the main data. This is effective in the error correction code processing of DVD.

9. Since the specific data is not protected by the ECC block of the main data, the error correction code is included in the own data series, the correction processing can thus be performed, and the specific data is securely detected.

10. When the main data block and specific data use the same error correction system as the error correction code, the system is simplified.

11. The data replaced with the specific data is destroyed. In the reproduction processing, when the data of another multiplexed/written region is copied, it is possible to quickly restore the original data.

As described above, according to the embodiments of the present invention, there can be provided a technique relating to the signal recording, transmission, reception, and reproducing method and apparatus, and signal recording medium in which the copy protection is further reinforced.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A signal processing method comprising:
   forming data packs by dividing main data to be processed into constant size data packs;
   forming data blocks including data sectors, in which the same data pack is multiplexed/arranged in at least two data sectors;
   adding an error correction code to each of the data blocks to constitute error correction coded blocks;
   replacing one of the at least two data sectors with specific data; and
   outputting the at least one error correction coded block after replacing the one of the at least two data sectors with the specific data to a transmission medium or a recording medium.

2. The method according to claim 1, wherein the error correction code is a product code.

3. The method according to claim 1, wherein the replacing comprises replacing data in rows of the error correction coded block with the specific data.

4. The method according to claim 1, wherein the replacing comprises replacing data in columns of the error correction coded block with the specific data.

5. The method according to claim 1, wherein the specific data includes an error correction code.

6. The method according to claim 1, wherein the part of the error correction coded block which is replaced with the specific data is predetermined.

7. The method according to claim 1, wherein the replacing comprises replacing data in every other row of the error correction coded block with the specific data.

8. A signal processing method for processing an error correction coded block transmitted through a transmission medium or reproduced from a recording medium, the error correction coded block being obtained by forming data packs by dividing main data to be processed into constant size data packs, forming data blocks including data sectors in which the same data pack is multiplexed/arranged in at least two data sectors, adding an error correction code to each of the data blocks to constitute the error correction coded blocks; replacing one of the at least two data sectors with specific data; and outputting the at least one error correction coded block after replacing the one of the at least two data sectors with the specific data to the transmission medium or the recording medium, the method comprising:
   reproducing an original error correction coded block by copying a data pack of another of the at least two data sectors to the one of the at least two data sectors; and
   performing an error detection/correction processing with respect to the original error correction coded block.

9. The method according to claim 8, wherein the error correction code is a product code.

10. The method according to claim 8, wherein the replacing comprises replacing data in rows of the error correction coded block with the specific data.

11. The method according to claim 8, wherein the replacing comprises replacing data in every other row of the error correction coded block with the specific data.

12. The method according to claim 8, wherein the replacing comprises replacing data in columns of the error correction coded block with the specific data.

13. The method according to claim 8, wherein the specific data includes an error correction code.

14. The method according to claim 8, wherein the part of the error correction coded block which is replaced with the specific data is predetermined.

15. A signal processing apparatus comprising:
   a data pack forming unit configured to form data packs by dividing main data to be processed into constant size data packs;
   a data block forming unit configured to form data blocks including data sectors, in which the same data pack is multiplexed/arranged in at least two data sectors;
   an adder configured to add an error correction code to each of the data blocks to constitute error correction coded blocks;
   a data replacing circuit configured to replace one of the at least two data sectors with specific data; and
   an output circuit configured to output the at least one error correction coded block after the one of the at least two data sectors is replaced with the specific data to a transmission medium or a recording medium.

16. The apparatus according to claim 15, wherein the data sector includes identification information indicating an address, other control information, and main data, and the main data is multiplexed/arranged in two data sectors.

17. The apparatus according to claim 15, wherein the error correction code is a product code including inner-code parities relating to a row and outer-code parities relating to a column.

18. The apparatus according to claim 15, wherein the specific data includes an error correction code.

19. The apparatus according to claim 15, wherein the block of the main data and the specific data are processed by the same error correction apparatus.

20. The apparatus according to claim 15, wherein the part of the error correction coded block which is replaced with the specific data is predetermined.

21. The signal processing apparatus according to claim 15, further comprising:
   a reproducing circuit configured to receive the error correction coded block output from the output circuit and configured to reproduce an original error correction coded block before replacing the specific data by copying to one of the at least two data sectors; and an error correction circuit configured to perform an error detection/correction processing with respect to the original error correction coded block.

22. The apparatus according to claim 15, wherein the data replacing circuit is configured to replace data in rows of the error correction coded block with the specific data.

23. The apparatus according to claim 15, wherein the data replacing circuit is configured to replace data in every other row of the error correction coded block with the specific data.

24. The apparatus according to claim 15, wherein the data replacing circuit is configured to replace data in columns of the error correction coded block with the specific data.

* * * * *